(12) United States Patent
Takita et al.

(10) Patent No.: US 6,198,686 B1
(45) Date of Patent: Mar. 6, 2001

(54) MEMORY DEVICE HAVING ROW DECODER

(75) Inventors: Masato Takita; Masato Matsumiya; Masatomo Hasegawa; Toshimi Ikeda, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/613,583

(22) Filed: Jul. 10, 2000

Related U.S. Application Data

(62) Division of application No. 09/342,059, filed on Jun. 29, 1999, now Pat. No. 6,111,795.

(30) Foreign Application Priority Data

Jun. 29, 1998 (JP) .................................................. 10-181736
Jul. 31, 1998 (JP) .................................................. 10-217830

(51) Int. Cl.[7] ...................................................... G11C 8/00
(52) U.S. Cl. ...................... 365/230.06; 326/105; 326/106
(58) Field of Search ........................ 365/230.06, 189.05, 365/189.01, 230.01; 326/106, 105, 104

(56) References Cited

U.S. PATENT DOCUMENTS

| | | | |
|---|---|---|---|
| 5,581,512 | 12/1996 | Kitamura . | |
| 5,712,584 | * 1/1998 | McClure | 327/198 |
| 5,808,482 | * 9/1998 | Rountree | 326/108 |
| 5,822,252 | * 10/1998 | Lee et al. | 365/185.3 |
| 5,844,857 | 12/1998 | Son et al. . | |
| 5,978,277 | * 11/1999 | Hsu et al. | 365/185.29 |
| 6,021,088 | * 2/2000 | Kim | 365/230.06 |

* cited by examiner

Primary Examiner—David Nelms
Assistant Examiner—Hoai V. Ho
(74) Attorney, Agent, or Firm—Arent Fox Kintner Plotkin & Kahn, PLLC

(57) ABSTRACT

On one hand, a row address is provided via a buffer gate to a row address register 11, and its output is provided via a complementary signal generation circuit 15 and a predecoder 16 to a word decoder 17A. On the other hand, in response to an issuance of an activate command a control signal AS1 is provided via a delay circuit 14 to the clock input CK of the row address register 11 as a strobe signal AS2, and AS2 is provided, to reduce timing margin, via a delay circuit 20A to the strobe signal input of the predecoder 16 as a strobe signal S2. S2 is provided via a delay circuit 20B to the strobe signal input of the word decoder 17A having RS flip-flops 2301 to 2332 or latch circuits. Each of the latch circuits consists of a NOR gate having a set input and a reset input and another NOR gate having an input coupled to receive the output of the former NOR gate and another set input to receive a multiple selection signal which is common for all the latch circuits in word decoders.

12 Claims, 23 Drawing Sheets

MEMORY DEVICE HAVING ROW DECODER

This application is a divisional application filed under 37 CFR § 1.53(b) of parent 1.53(B) of parent application Ser. No. 09/342,059, filed: Jun. 29, 1999, now U.S. Pat. No. 6,111,795.

BACKGROUND OF THE INVENTION

1. Field of the Invention

The present invention relates to a memory device such as a dynamic random access memory (DRAM) having row decoder with a reduced timing margin or a reduced through-current.

2. Description of the Related Art

For memory device, high speed operation is required with the high speed operation of micro processor unit (MPU).

FIG. 18 shows a circuit of a row address system of a prior art memory 10. N-shaped bending lines in the drawings denote long-distance wiring in a chip.

Row address having A8 through A15 bits from external is provided to the data input of a row address register 11 via a buffer gate 12A for a signal level interface, while a chip selection signal *CS (* denotes that its signal is active when it is low), a row address strobe signal *RAS, a column address strobe signal *CAS, a write enable signal *WE, a clock enable signal CKE and a clock signal CLK, which are from external, are provided via a buffer gate 12B to a control circuit 13 including a command decoder and generating various control signals. For example, as one of the control signals, a signal AS1 activated in response to issuance of an activate command is generated.

Meanwhile, a signal propagation delay time of long-distance wiring in a chip depends on the variance of parasitic resistance and parasitic capacity resulting from variance in production processes, variance per chip in power source voltage used, and changes in temperatures. Furthermore, since the distances from the pads on a chip for the row address of A8 through A15 to the row address register 11 differ from bit to bit, skews will occur among signals.

FIG. 19 are time charts showing operations of FIG. 18. In FIG. 19, each solid line shows a case where the signal propagation delay time is the mean, each dashed line and each dotted line show cases where the signal propagation delay time is the maximum and the minimum causing from the above-described reasons, respectively.

It is assumed that the row address signal ADR0 and the control signal CMD0 at the outputs of the buffer gates 12A and 12B, respectively, change simultaneously at a time T1. The front edges of the row address ADR1 at the data input of the row address register 11 and the control signal AS1 as a strobe signal near the clock input CK of the row address register 11 delay from the time T1 as shown in FIG. 19.

In a case where the signal propagation delay time to the data input of the row address register 11 is the largest and the signal propagation delay time to the clock input CK of the row address register 11 is the smallest, in order to hold row addresses in the row address register 11 without error, it is necessary to delay the control signal AS1 by a time TD1 shown in FIG. 19 in a timing generation circuit 14 to generate a strobe signal AS2 and to provide it to the clock input CK of the row address register 11.

Output of the row address register 11 is provided via a complementary signal generation circuit 15 and a predecoder 16 to a word decoder 17. These complementary signal generation circuit 15, predecoder 16 and word decoder 17 constitute a row address decoder. The word decoder 17 is formed along one side of one memory block in a memory core block 18A, and the word decoder 17 is located near one side of a chip. Since the number of output lines of the complementary signal generation circuit 15 is twice as many as that of input lines, the circuit 15 and 16 are formed near the word decoder 17 to decrease the length of many lines. Since a memory core block 18B is formed to-be symmetrical with the memory core block 18A and a word decoder in the memory core block 18B is formed near the opposite side of the chip, the row address register 11 is formed near the middle point between the memory core blocks 18A and 18B.

Therefore, the wiring from the row address register 11 to the complementary signal generation circuit 15 is long.

Memory cells (not shown) in row are coupled to each word line WL shown with dotted line in FIG. 18 and the word lines are connected to the output of the word decoder 17. Memory cells (not shown) in column are connected to bit lines BL and *BL which are connected to a circuit 19 including a sense amplifier, a precharge circuit and a column gate. Memory cells in a row are selected with an activate word line and contents thereof are read onto bit lines. Since the word decoder 17 is provided with a logic gate circuit for each word lines WL, there is no allowance for arranging other circuits in this circuit area. If there is a skew among the edges of the input signal to the word decoder 17, an erroneous word line will be selected for a moment.

Therefore, in order to secure the output timing of the word decoder 17, the timing of the output PDA0 of the, predecoder 16 at the preceding stage is secured. Namely, a signal S1 on the same line of the control signal AS1 is delayed at a timing generation circuit 20 to generate a strobe signal S2, and this signal is provided to the predecoder 16.

The output ADR2 of the row address register 11, the input ADR3 of the complementary signal generation circuit 15, the output CADR0 of the circuit 15 and the input CADR1 of the predecoder 16 are delayed one after another as shown in FIG. 19.

As in the above description, in a case where the signal propagation delay time to the data input of the predecoder 16 is the largest and the signal propagation delay time to the strobe signal input of the predecoder 16 is the smallest, in order to prevent the output signal PDA0 of the predecoder 16 from a skew, it is necessary to delay the signal S1 by a time TD2 shown in FIG. 19 in a timing generation circuit 20 to generate a strobe signal S2 and to provide it to the strobe signal input of the predecoder 16. The output PDA0 of the predecoder 16 changes on the front edge of the strobe signal S2 as shown in FIG. 19.

However, since the time from a change in the row address signal of A8 through A15 till a change in the signal on a selected word line WL becomes long due to the delay times TD1 and TD2 at the timing generation circuits 14 and 20, the high speed operation of the memory 10 is hindered.

On the other hand, low power consumption is required in memory devices for uses in portable electronic devices.

In a synchronous DRAM, since it is provided with a plurality of banks which enables a high speed access with switching over banks in every clock pulse and operating the banks in parallel. To enable this parallel operation, latch circuits are connected, for respective word lines, at the output stage in word decoder circuits to which signals obtained by predecoding the row addresses are provided.

FIG. 20 shows a circuit for one word line, which is a part of a word decoder.

A word decoding circuit 60 is a NAND gate in which NMOS transistors 61 and 62 are connected in series, and predecoded signals SS1 and SS2 are provided to gate electrodes of the NMOS transistors 61 and 62, respectively. To select a word line WL, the predecoded signals SS1 and SS2 are made high, whereby the signal SS3 goes low. The signal SS3 is hold in a latch circuit 70, and a signal SS4 generated with inverting the signal SS3 is outputted from the latch circuit 70.

In the latch circuit 70, inverters 71 and 72 are connected in ring-shaped, and an NMOS transistor 73 for setting is connected between the output of the inverter 72 and the ground potential, and an NMOS transistor 74 for resetting is connected between the output of the inverter 71. and the ground potential.

The drive capacity of the signal SS4 is amplified by a driver 80 to drive the word line WL.

Since a memory device is activated in units of a block in order to reduce power consumption, a word reset signal WRST is commonly provided to all the latch circuits in an activated memory block when an access is finished, whereby the NMOS transistor 74 is turned on, and the signal SS4 and the word line WL goes low.

Before shipment of memories, in order to carry out an acceleration test at a high-temperature in a state where all the word lines are high, signal lines of a multiple selection signal WMSEL is commonly connected to all the latch circuits in all the word decoders. In the test, the multiple selection signals WMSEL is made high, and the NMOS transistor 73 is turned on to cause the input of the inverter 71 to go low and the output SS4 to become high.

FIG. 21 shows a structure of the latch circuit 70 in FIG. 20.

The inverter 71 is such that a PMOS transistor 711 and an NMOS transistor 712 are connected in series between the power source potentials VDD and VSS, and the both gate electrodes are commonly connected to receive the signal SS3. Similarly, the inverter 72 is such that a PMOS transistor 721 and an NMOS transistor 722 are connected in series, and the both gate electrodes are commonly connected to receive the signal SS4.

When the signal SS3 is low, the PMOS transistor 711 is on and NMOS transistor 712 is off. In this state, if the word line reset signal WRST is made high, an NMOS transistor 74 is turned on, and a through-current flows from the power source potential VDD through the PMOS transistor 711 and the NMOS transistor 74 to the power source potential VSS. When the signal SS4 goes low, the PMOS transistor 721 and NMOS transistor 722 are changed to on and off, respectively, the signal SS3 becomes high, and the PMOS transistor 711 and the NMOS transistor 712 are turned off and on, respectively, whereby the through-current is prevented. However, since the through-current flows until this state is established, useless power is consumed.

Similarly, if the multiple selection signal WMSEL is changed to high in the above high-temperature acceleration test in a state where the signal SS4 is low, the PMOS transistor 721 is on and the NMOS transistor 722 is off, a through-current is caused to flow from the power source potential VDD through the PMOS transistor 721 and the NMOS transistor 73, and the through-current continues until the signal SS4 is changed to high and the PMOS transistor 721 is turned off. In this case, since the through-current is simultaneously caused to flow in each latch circuit 70 in a chip, it cannot be disregarded. Next, the multiple selection signal WMSEL returns to low. In this state, the word line reset signal WRST is changed to high in each latch circuit 70 in all the memory blocks, whereby a through-current passing through the PMOS transistor 711 and the NMOS transistor 74 flows in each latch circuits. Therefore, the through-current cannot be disregarded. For this reason, a high-temperature acceleration test will become inaccurate.

On the other hand, since a latch circuit 70 is provided for each word line, the occupying area of the latch circuits are limited.

FIG. 22 shows a layout pattern of a diffusion area and a polysilicon wiring layer of the adjacent two latch circuits. In FIG. 22, the pattern of a metal wiring layer is not shown to avoid complication. FIG. 23 is a circuit diagram in which transistors are disposed in correspondence to the layout pattern of FIG. 22 for better understanding the pattern of FIG. 22.

In order to reduce the occupying area of the latch circuits and to narrow the width thereof, a PMOS transistor group 70P and an NMOS transistor group 70N are arrayed separately to each other and further, the PMOS transistor group 70P and the NMOS transistor group 70N are disposed along the word line direction in a band form. In FIG. 22, 721P and 711P are a p-type diffusion area of the PMOS transistors 721 and 711, respectively, while 712N, 722N, 74N and 73N are an n-type diffusion area of the NMOS transistors 712, 722, 74 and 73, respectively. The hatched areas denote polysilicon wirings, and small rectangles are between-layer contact holes. As regards the wirings of dotted patterns, the wiring at the side of the transistor group 70P is for applying a power source potential VDD to the N well, and the wiring at the side of the transistor group 70N is for applying a power source potential VSS to the P well.

If the circuit is complicated and the circuit width in the column direction is widened by providing latch circuits with through-current preventing means, the word line pitch is increased and the memory cell density is reduced, resulting in reducing the memory capacity or increasing in chip area with lengthening the width in a column direction.

SUMMARY OF THE INVENTION

Accordingly, it is an object of the present invention to provide a memory device having a row decoder with a reduced timing margin for higher speed operation.

It is another object of the present invention to provide a memory device having a row decoder with a reduced through-current in latch circuits without increasing its occupying area on a chip.

In the first aspect of the present invention, there is provided a memory device comprising: a buffer gate having an input to receive a row address; a row address register having a data input coupled to an output of the buffer gate, having a clock input; a complementary signal generation circuit having a data input coupled to a data output of the row address register; a predecoder having a data input coupled to a data output of the complementary signal generation circuit; a word decoder having a data input coupled to a data output of the predecoder; a control circuit for providing a control signal; a first timing generation circuit for delaying the control signal to generate a first strobe signal, the first strobe signal being provided to the clock input of the row address register; and a second timing generation circuit for delaying the first strobe signal to generate a second strobe signal, wherein a downstream side circuit which is downstream from the row address register has a strobing circuit, coupled in a data stream, for strobing its input data in response to the second strobe signal.

With the first aspect of the present invention, the row address is outputted from the row address register at the timing of the activation of the 1st strobe signal, and arrival of the address signal at the data input of the downstream side circuit becomes early or late according to early or late arrival of the 1st strobe signal at the clock input of the row address register due to variance of the signal propagation delay. Therefore, the timing is good if all the signal components at the downstream side circuit has changed in a case where the signal propagation to the data input of this circuit is the latest (or the earliest) and the signal propagation to the strobe signal input of this circuit is the latest (or the earliest), resulting in reducing in the timing margin. Thereby, the time from changing in a row address to activating the word line can be further shortened than that in the prior art, and a higher speed operation of a memory device can be achieved.

In the second aspect of the present invention, there is provided a memory device including a word decoder, the word decoder comprising: a word decoding circuit having an output to provide a set signal in response to a predecoded row-address signal; and a latch circuit coupled between the output of the word decoding circuit and one of word lines in a memory cell array, wherein the latch circuit comprises: a PMOS transistor and an NMOS transistor connected in series between first and second power source potentials; a first MOS transistor connected in parallel to one of the PMOS transistor or the NMOS transistor; and a second MOS transistor connected in series to the other of the PMOS transistor or the NMOS transistor, the second MOS transistor being operated in such a way that the on/off states of the first and second MOS transistors are reverse to each other.

With the second aspect of the present invention, since the second MOS transistor is turned off if the first MOS transistor is turned on, a through-current is prevented by the second MOS transistor, whereby power consumption is reduced.

Furthermore, since addition to this logic gate circuit is only the second MOS transistor, the occupying area on a chip will be prevented from increasing.

Other aspects, objects, and the advantages of the present invention will become apparent from the following detailed description taken in connection with the accompanying drawings.

DESCRIPTION OF THE PREFERRED EMBODIMENTS

Figure 1:
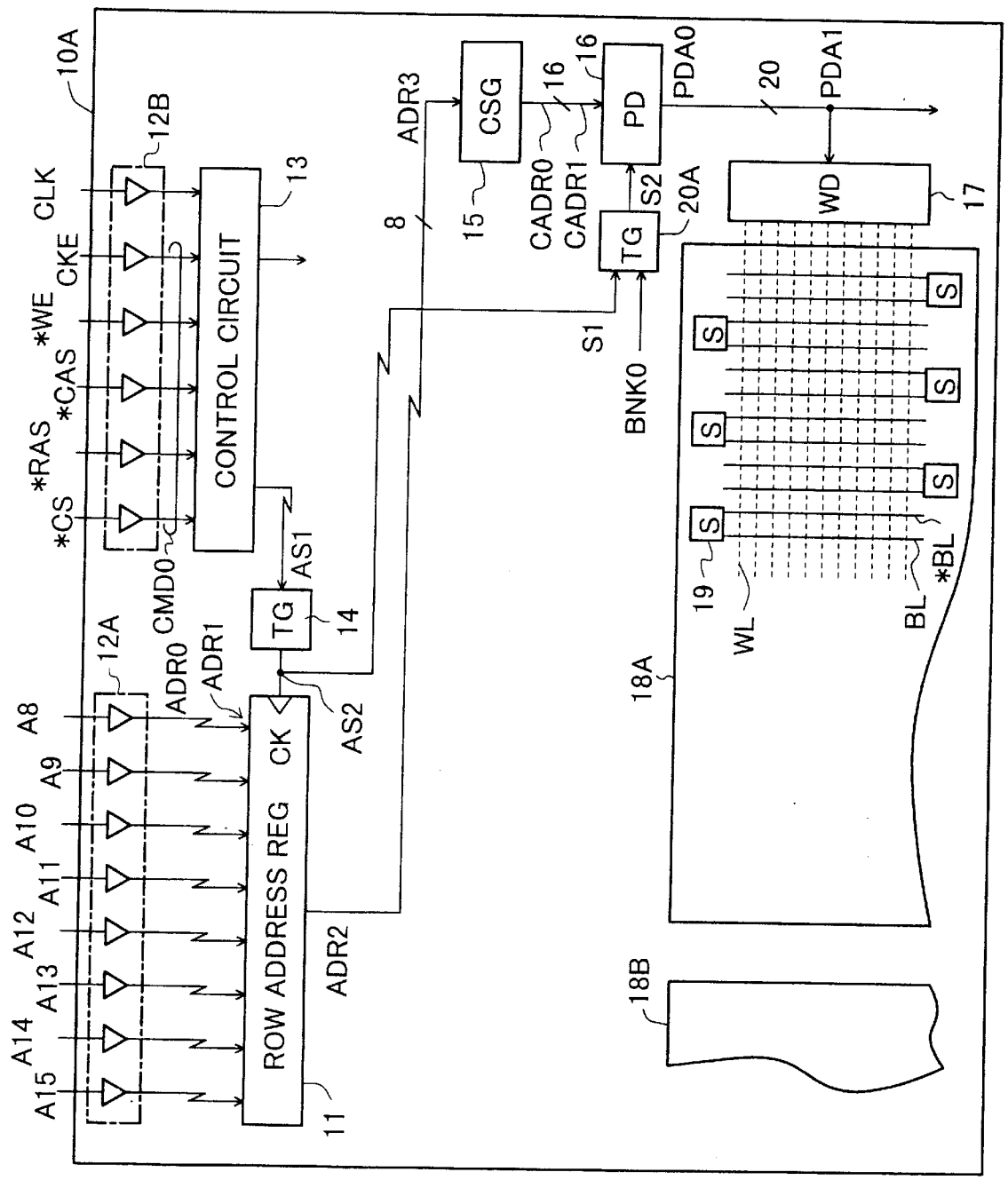
FIG. 1 is a schematic diagram showing a circuit of a row address system in a memory device according to the first embodiment of the present invention.

Referring now to the drawings, wherein like reference characters designate like or corresponding parts throughout several views, preferred embodiments of the present invention are described below.

First Embodiment

FIG. 1 shows the schematic structure of the circuit of a row address system in a memory device 10A, for example, a synchronous DRAM. The description about the same part as that of FIG. 18 is omitted.

In the circuit, the output of a timing generation circuit 14 is connected to the input of a timing generation circuit 20A. In addition, a bank selection signal BNK0 held in a bank address register (not shown) is provided to the timing generation circuit 20A. The signal BNK0 is to select 18A from the memory core blocks 18A and 18B.

Figure 18:
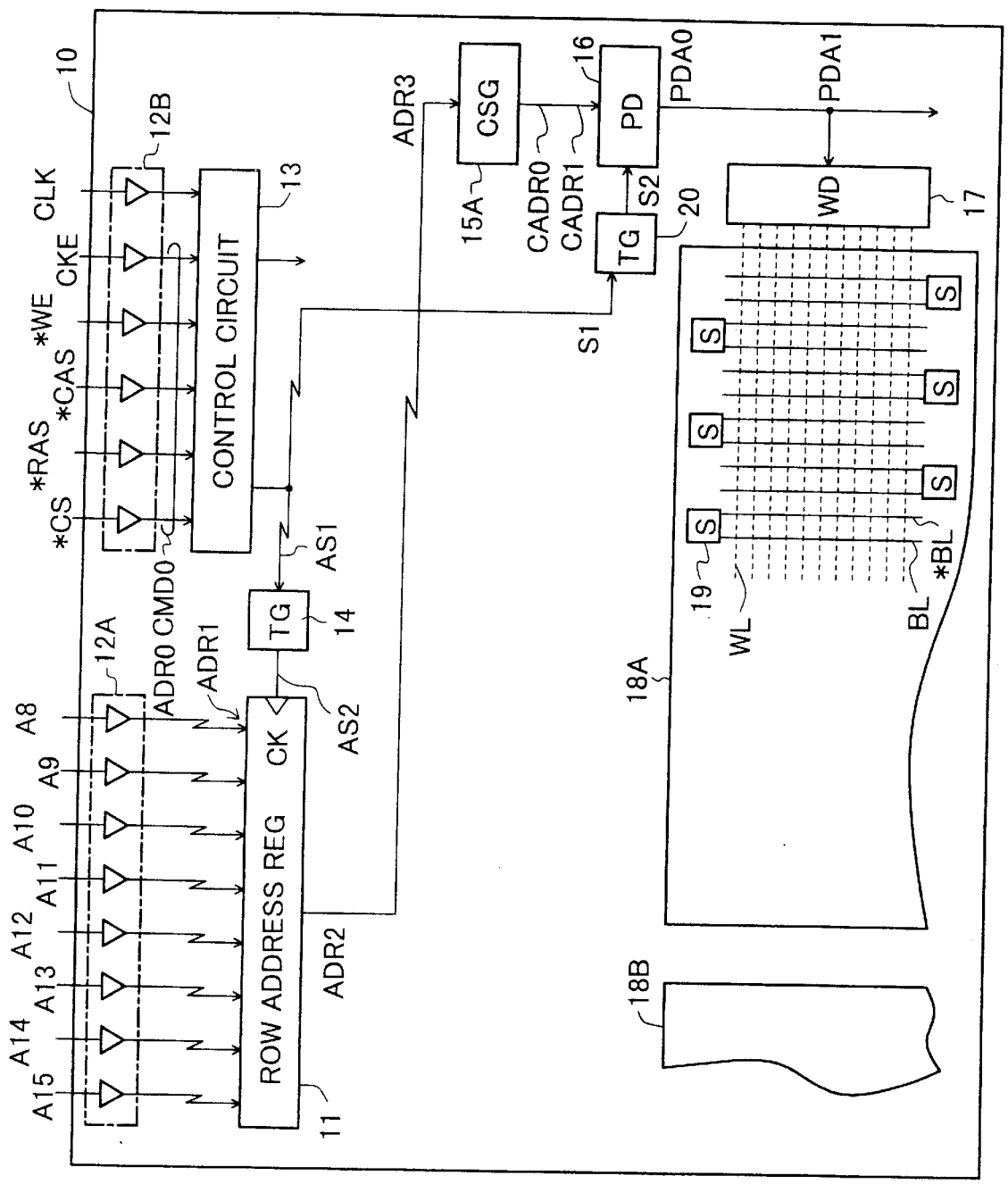
FIG. 18 is a schematic diagram showing a circuit of a row address system in a prior art memory device.

All other points are the same as those in FIG. 18.

Figure 2:
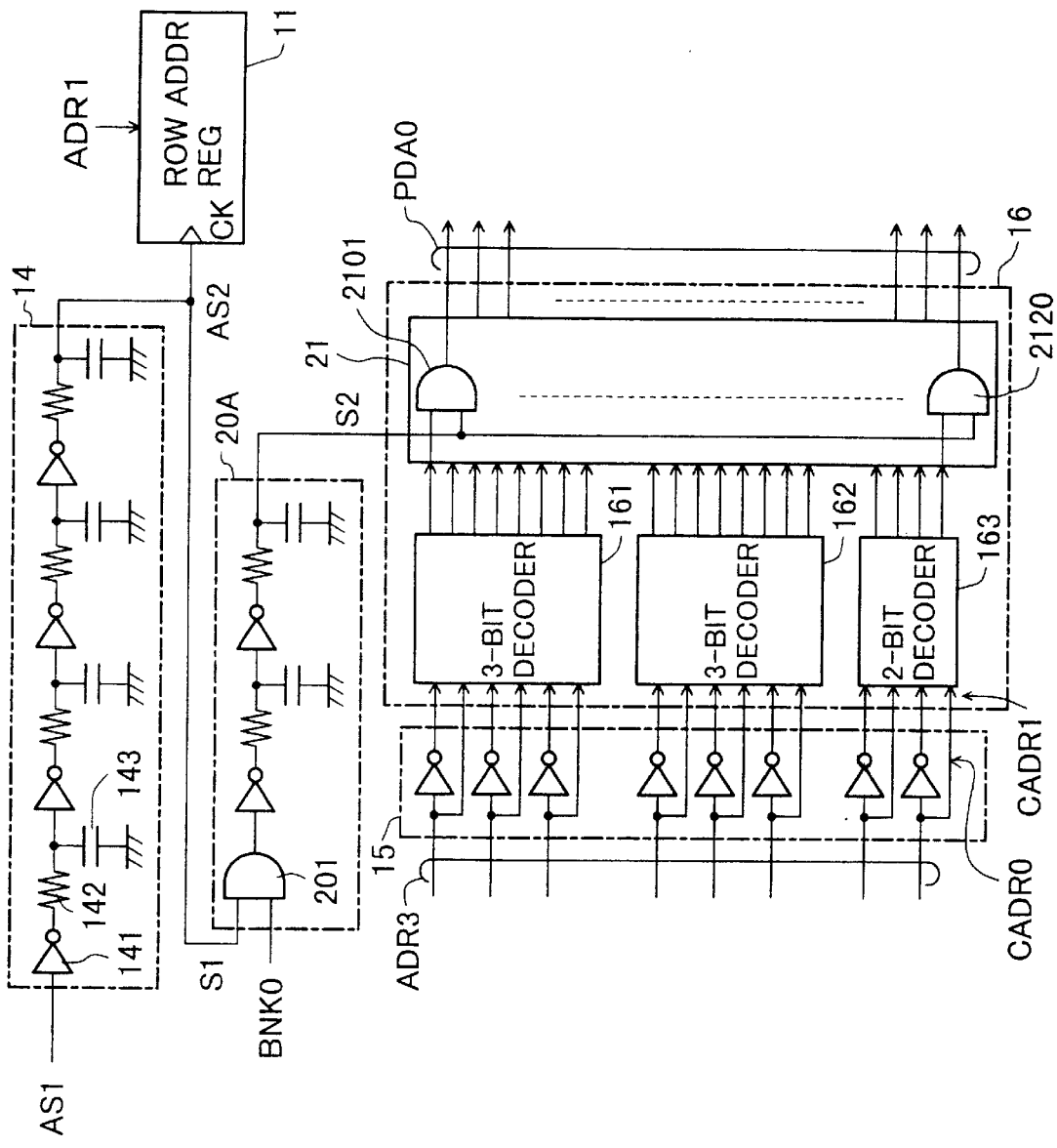
FIG. 2 is a schematic diagram showing a structural example of part of the circuit of FIG. 1.

FIG. 2 shows a structural example of a part of the circuit of FIG. 1.

The timing generation circuit 14 consists of four-stage basic delay circuits and in each of which the output of the inverter 141 is connected to the CR integration circuit consisting of a resistor 142 and a capacitor 143. The capacitor 143 is, for example, such a MOS capacitor that the source of an NMOS transistor is short-circuited to the drain thereof and connected to a ground line.

In the timing generation circuit 20A, a two-stage basic delay circuit is connected to the output of an AND gate 201, and the above-mentioned signals S1 and BNK0 are provided to the AND gate 201.

A complementary signal generation circuit 15 is provided with an inverter for each output bit of the row address register 11, therefore the construction thereof is simple, and the input and output thereof are provided to a predecoder 16. In the predecoder 16, a 7-bit address is decoded by 3-bit decoders 161, 162 and a 2-bit decoder 163, and the outputs of the decoders 161, 162 and 163 are provided to a strobe circuit 21. The circuit 21 consists of twenty AND gates 2101 through 2120, wherein the output corresponding to the decoders 161 through 163 are provided to one input thereof while a strobe signal S2 is commonly provided from the timing generation circuit 20A to the other input thereof.

Next, a description is given of the operations of the first embodiment constructed as described above.

Figure 3:
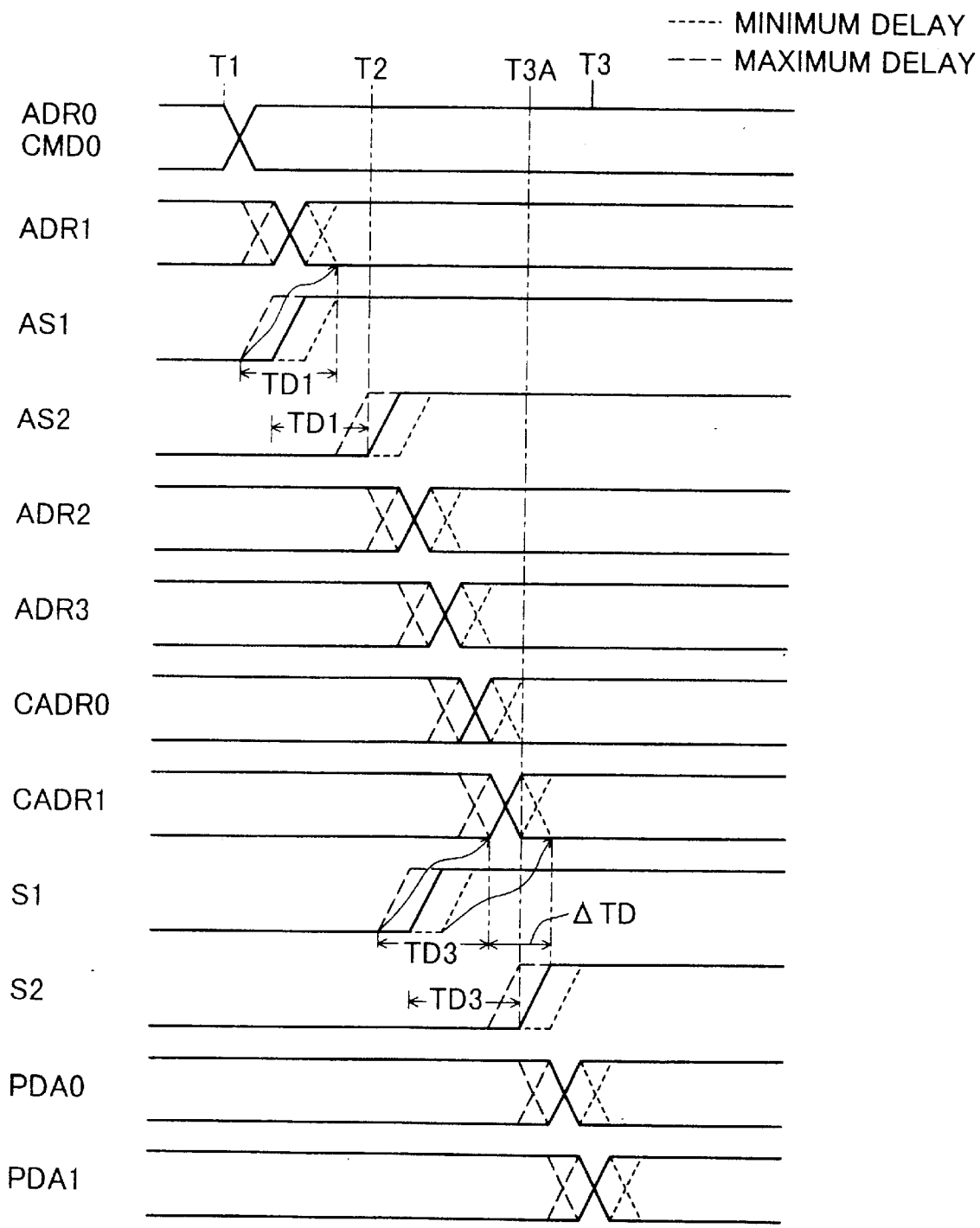
FIG. 3 are time charts showing operations of the circuit of FIG. 1.

FIG. 3 are time charts showing operations of the circuit of FIG. 1.

Row address of A8 through A15 and control signal of *CS (* denotes that its signal is active with being low, and this is the same hereinafter), *RAS, *CAS, *WE and CKE, coming from external, are converted to an internal signal level by buffer gates 12A and 12B, respectively, and become a row address ADR0 and a control signal CMD0. It is assumed that these signals ADR0 and CMD0 at the outputs of the buffer gates 12A and 12B, respectively, change simultaneously at a time T1.

The row address ADR0 is propagated to the input of the row address register 11 as ADR1. The control signal CMD0 is provided to the control circuit 13, wherein a control signal AS1 corresponding to the row address strobe signal RAS is provided to the timing generation circuit 14. The timing generation circuit 14 delays the signal AS1, and provides it as a strobe signal AS2 to a clock input CK, which acts as a strobe signal input, of the row address register 11. The row address ADR1 is latched in the row address register 11 on a rise of the strobe signal AS2, and the register 11 outputs the latched address as ADR2.

The row address ADR2 is propagated to the input of the complementary signal generation circuit 15 as ADR3, and a complementary signal CADR0 is generated by the circuit 15. The complementary signal CADR0 is propagated to the input of the predecoder 16 as CADR1.

On the other hand, the strobe signal AS2 is propagated to one input of the timing generation circuit 20A as a signal S1.

In a case where the bank selection signal BNK0 is low, the output of the AND gate 201 becomes low, not dependent on a change of the signal S1. Thereby, all the output bits of the predecoder 16 becomes low, and no word line is selected in the memory core block 18A while a word line is selected in the memory core block 18B.

In a case where the bank selection signal BNK0 is high, a strobe signal S2 is generated with delaying the signal S1. In response to the signal S2 changing to high, the outputs of the decoders 161 through 163 begin to pass through the strobe circuit 21, and its output is provided as a signal PDA0. The signal PDA0 is provided to the input of the word decoder 17 as PDA1, whereby one word line corresponding to the signal PDA1 is selected by the word decoder 17.

Figure 19:
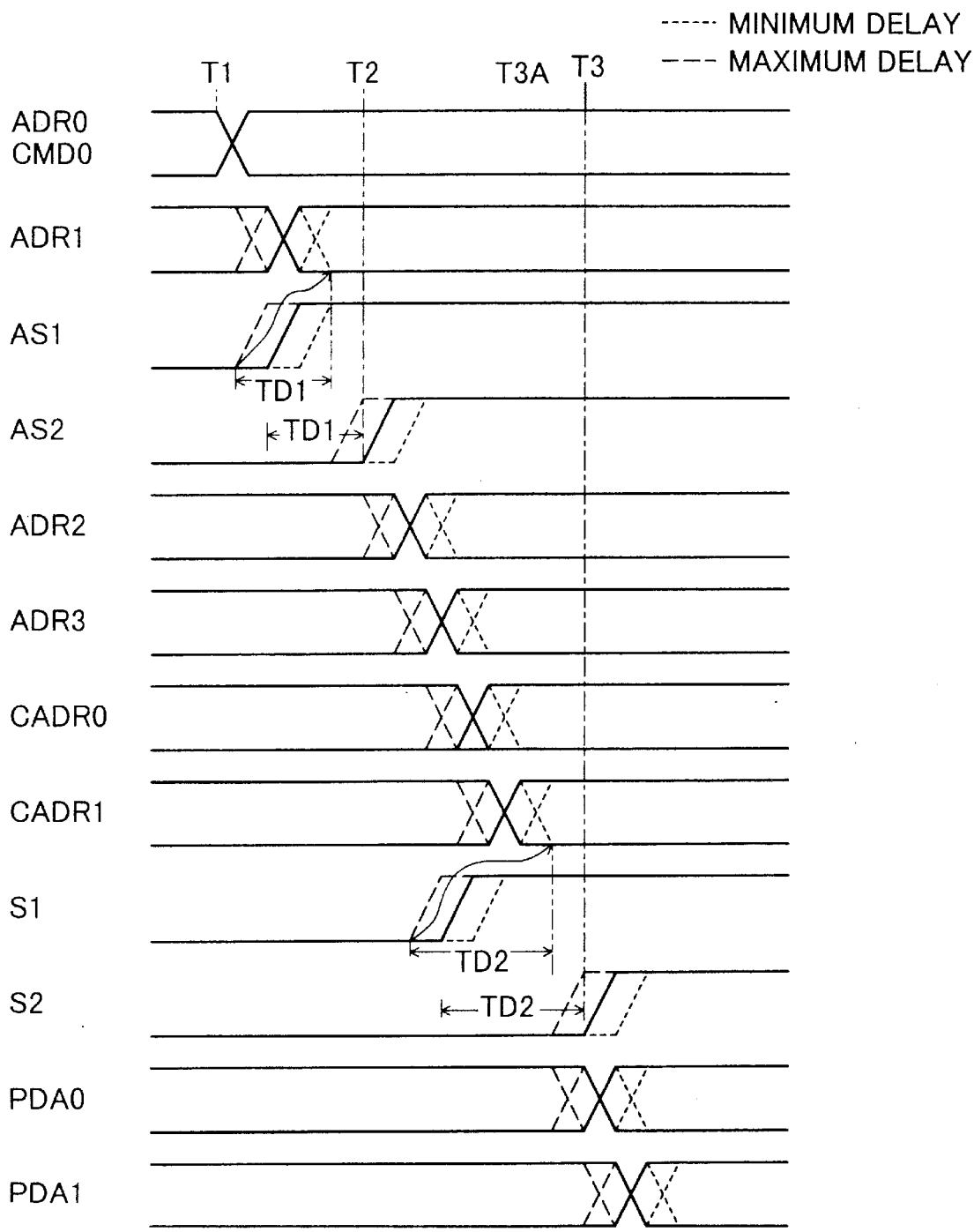
FIG. 19 are time charts showing operations of the circuit of FIG. 18.

In FIG. 3, signals from the upper extreme end to the complementary signal CADR1 are respectively the same as the corresponding signals in FIG. 19.

Since the row address ADR2 changes at the timing of the front edge of the strobe signal AS2, the arrival of the complementary signal CADR1 to the predecoder 16 is made early or late in compliance with an early or late arrival of the signal S1 to the timing generation circuit 20A, respectively, due to the cause described in the background of the invention. Therefore, the timing is good if all the output signal components of the predecoder 16 has changed in a case where the signal propagation to the data input of the predecoder 16 is the latest (or the earliest) and the signal propagation to the strobe signal input of the predecoder 16 is the latest (or the earliest). Thus, a strobe signal S2 is generated with delaying the signal Si in the timing generation circuit 20A by a time TD3 shown in FIG. 3, and the signal S2 is provided to the strobe signal input of the predecoder 16.

Thereby, the point of transition of the strobe signal S2 is made earlier by a time ΔTD=T3−T3A than in the case of FIG. 19, and the time from a change in the row address to a rise of the word line is further shortened than in the prior art, resulting in high speed operation of the memory device 10A.

Second Embodiment

Figure 4:
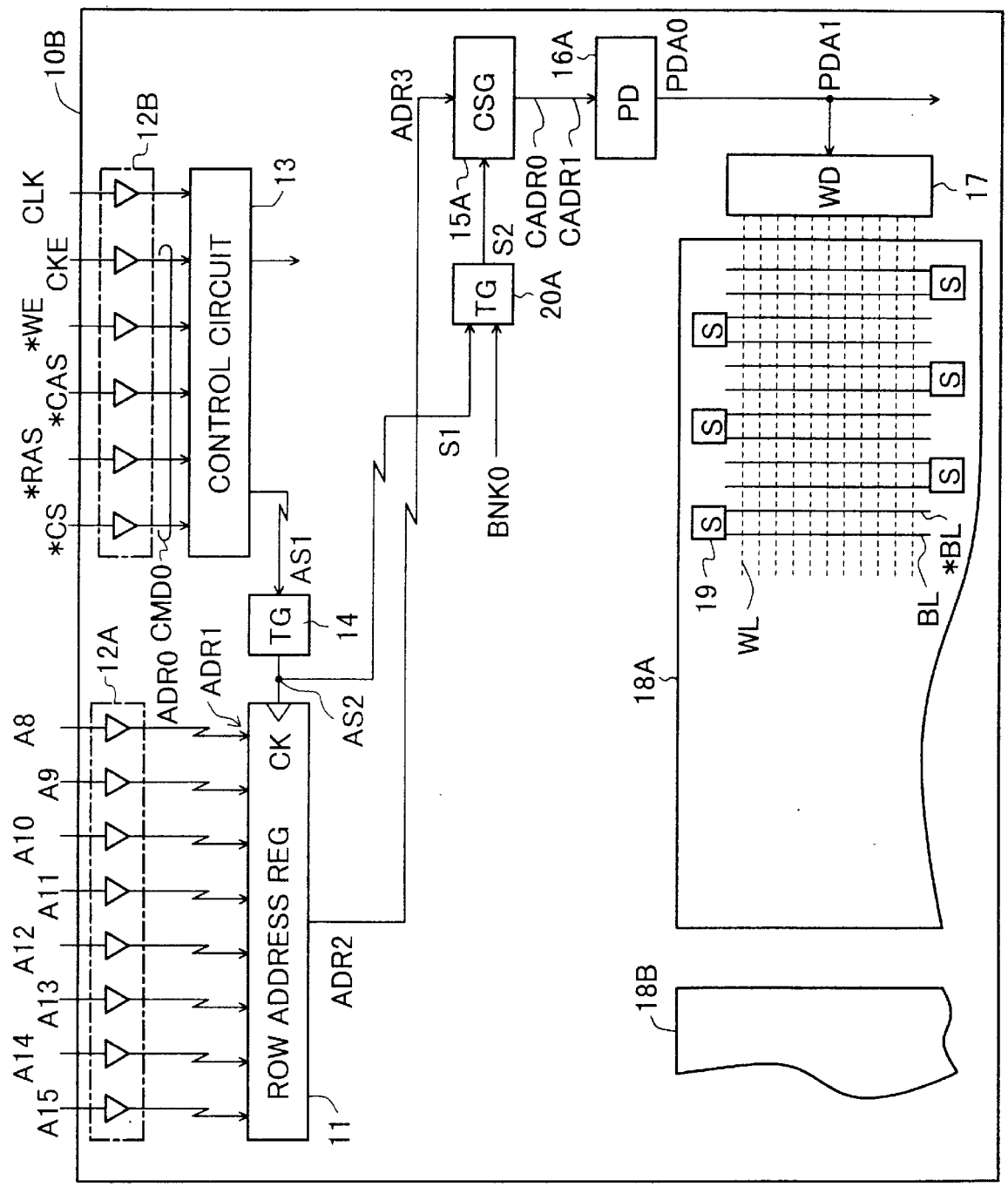
FIG. 4 is a schematic diagram showing a circuit of a row address system of in a memory device according to the second embodiment of the present invention.

FIG. 4 shows a schematic structure of a circuit of a row address system in a memory device 10B according the second embodiment of the present invention.

Figure 5:
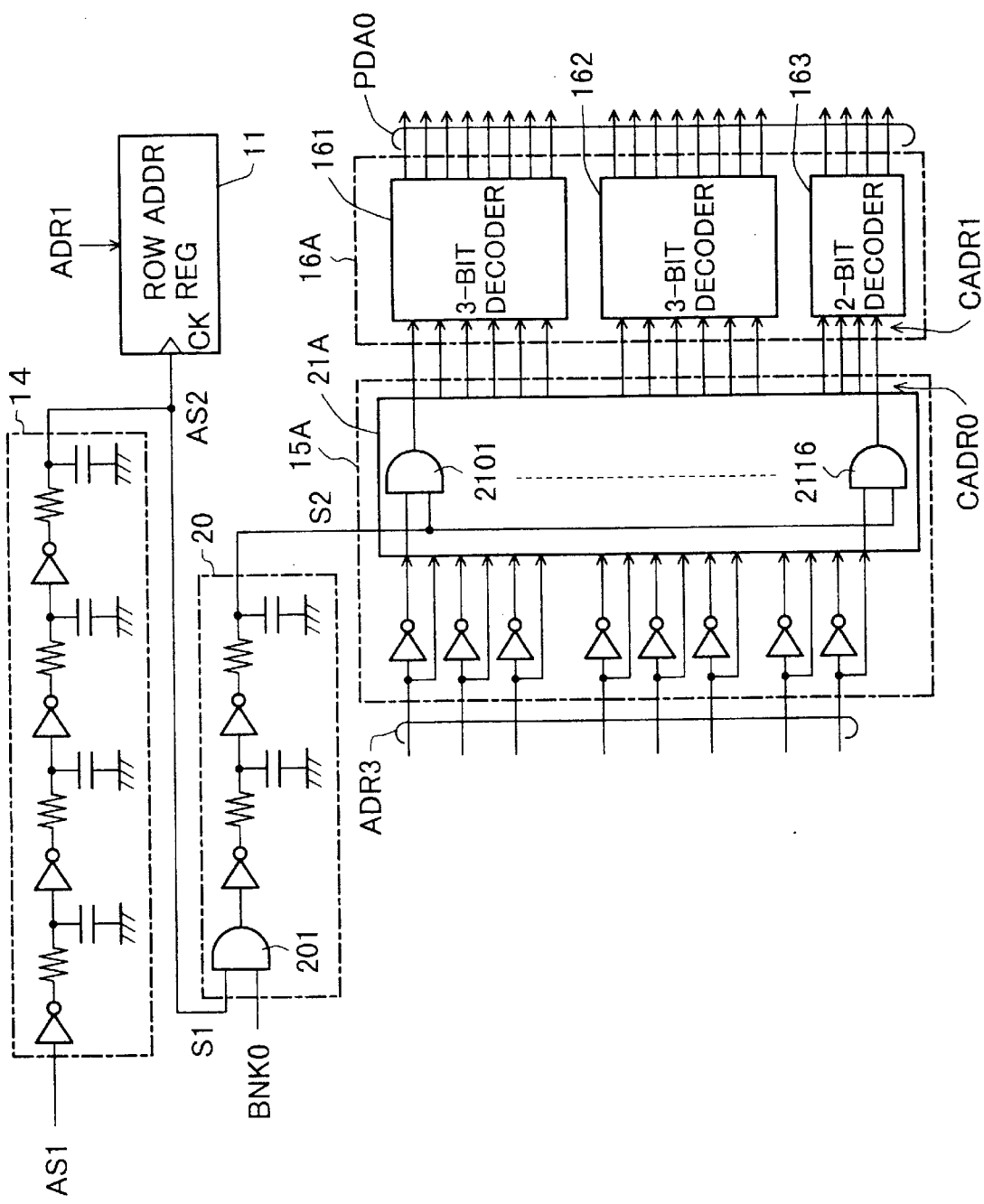
FIG. 5 is a schematic diagram showing a structural example of a part of the circuit of FIG. 4.

In the circuit, the timing adjustment at the output of the complementary signal generation circuit 15A is performed instead of the timing adjustment at the output of the predecoder 16A. As shown in FIG. 5, the circuit 15A is provided with a strobe circuit 21A consisting of AND gates 2101 through 2116 at the output stage. Each of the complementary signals at the preceding stage is provided to each one-side input of the AND gates 2101 through 2116, and a strobe signal S2 from the timing generation circuit 20A is commonly provided to the other-side inputs thereof, whereby it is not necessary to provide the predecoder 16A with the strobe circuit 21.

Since the complementary signal generation circuit 15A is formed near the predecoder 16A, effect which is almost the same to that of the first embodiment can be obtained. In addition, since the number of AND gates of the strobe circuit 21A is made fewer than that of the strobe circuit 21 in FIG. 2, the structure will be further simplified.

Third Embodiment

Figure 6:
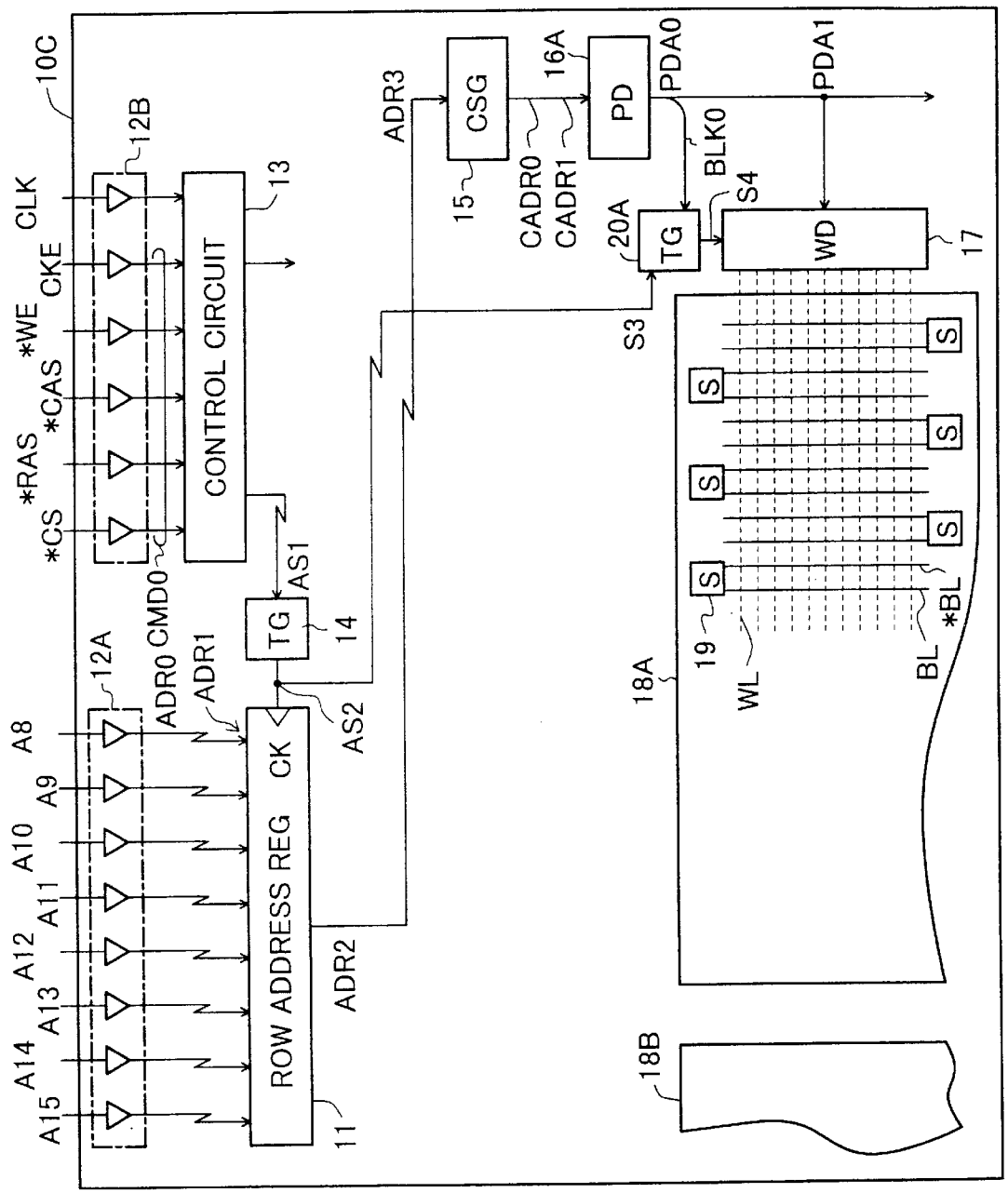
FIG. 6 is a schematic diagram showing a circuit of a row address system in a memory device according to the third embodiment of the present invention.

FIG. 6 shows the schematic structure of a circuit of a row address system in a memory device 10C according to the third embodiment of the present invention.

In the circuit, the timing adjustment at the outputs of the word decoder 17 is performed instead of the timing adjustment at the output of the predecoder 16A or the complementary signal generation circuit 15.

Figure 7:
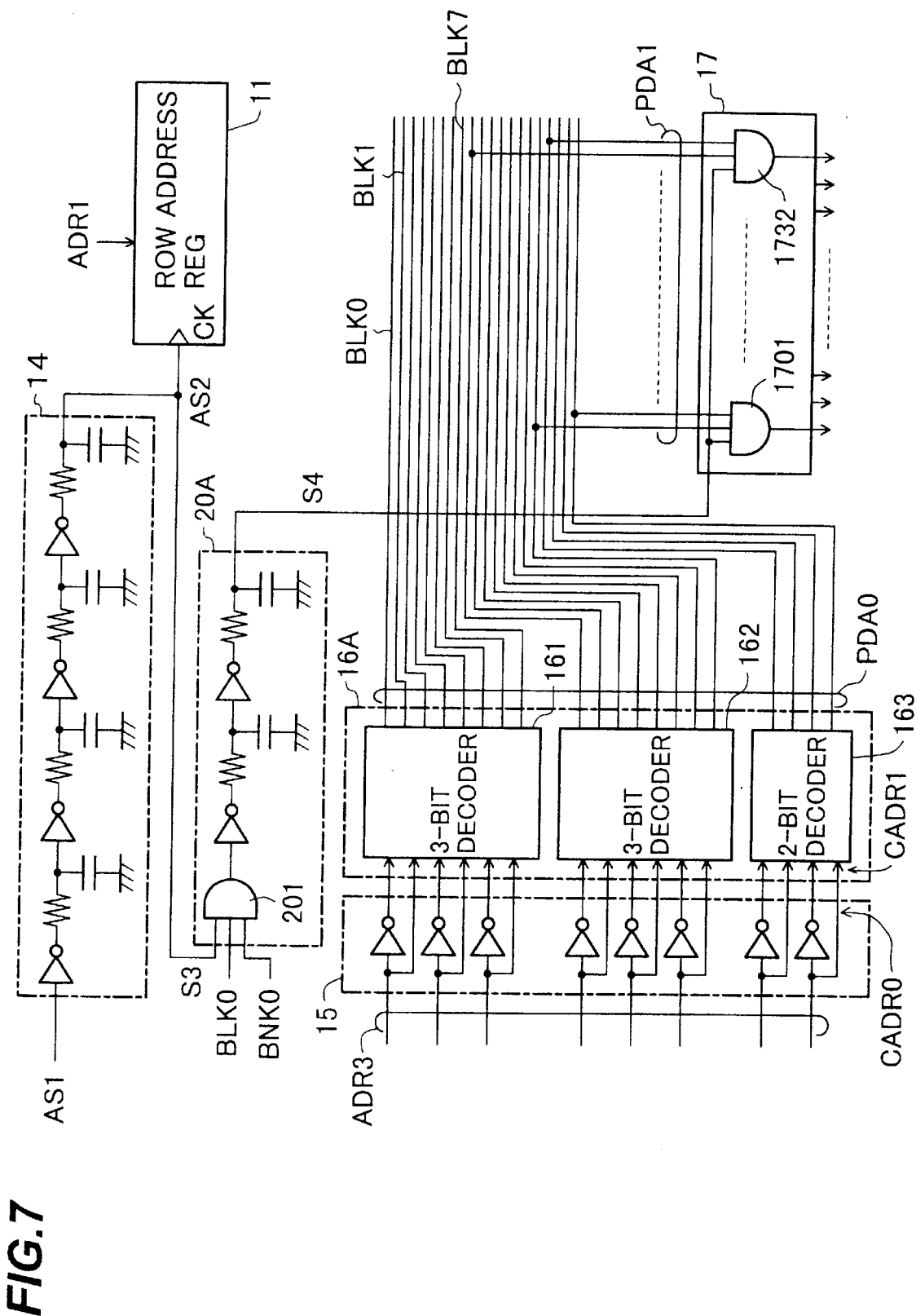
FIG. 7 is a schematic diagram showing a structural example of a part of the circuit of FIG. 6.

As shown in FIG. 7, the word decoder 17 consists of AND gates 1701 through 1732, each of which is connected to receive a different combination of an output component of the 3-bit decoder 162 and an output component of the 2-bit decoder 163. Further, the AND gates 1701 through 1732 are connected to receive the strobe signals S4 commonly from the timing generation circuit 20A.

The memory core block 18A has eight memory block selected by respective memory block selection signals BLK0 through BLK7 which are outputs of the 3-bit decoder 162. The memory block selection signal BLK0 becomes high only when the memory block corresponding to the word decoder 17 is selected. The memory block selection signal BLK0 and the bank selection signal BNK0 are provided to the AND gate 201 in the timing generation circuit 20A.

About the other memory blocks (not shown), it is similar to those described above.

Although it is necessary to provide a strobe signal S4 to the word decoder 17, it is not necessary to provide the memory block selection signal BLK0 to the word decoder 17 with providing the memory block selection signal BLK0 to the timing generation circuit 20A. Accordingly, the structure of the word decoder 17 is the same as the word decoder in FIG. 1 (in the case of FIG. 1, BLK0 is provided instead of S4), and the complication thereof can be avoided. It is not necessary to provide the circuit 15 or 16A with a strobe circuit.

According to the third embodiment, since the timing of the output of the word decoder 17 is directly adjusted, it is possible to more securely prevent the output of the word decoder from an error for a moment than in the first and second embodiments.

Fourth Embodiment

Figure 8:
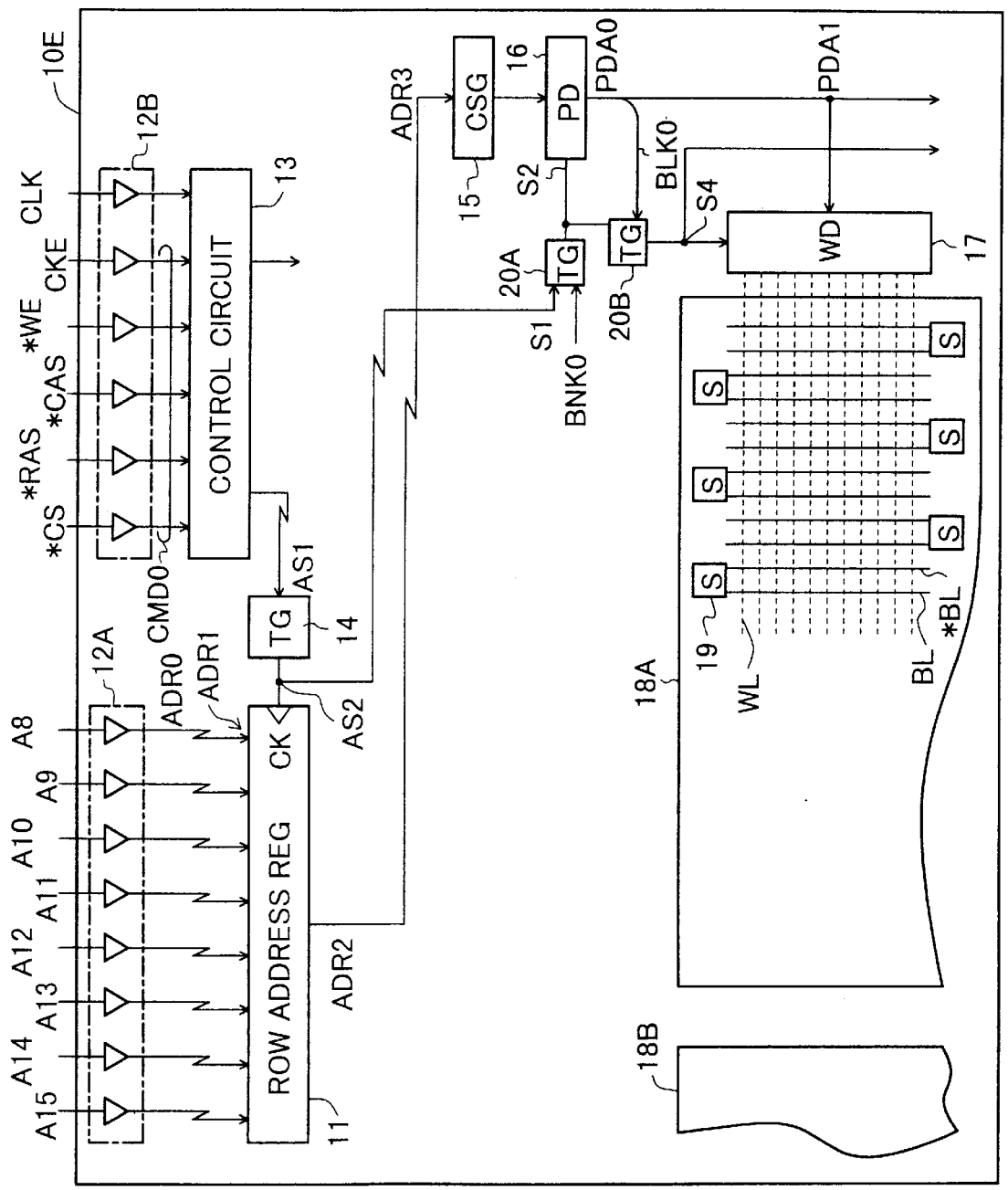
FIG. 8 is a schematic diagram showing a circuit of a row address system in a memory device according to the fourth embodiment of the present invention.
Figure 9:
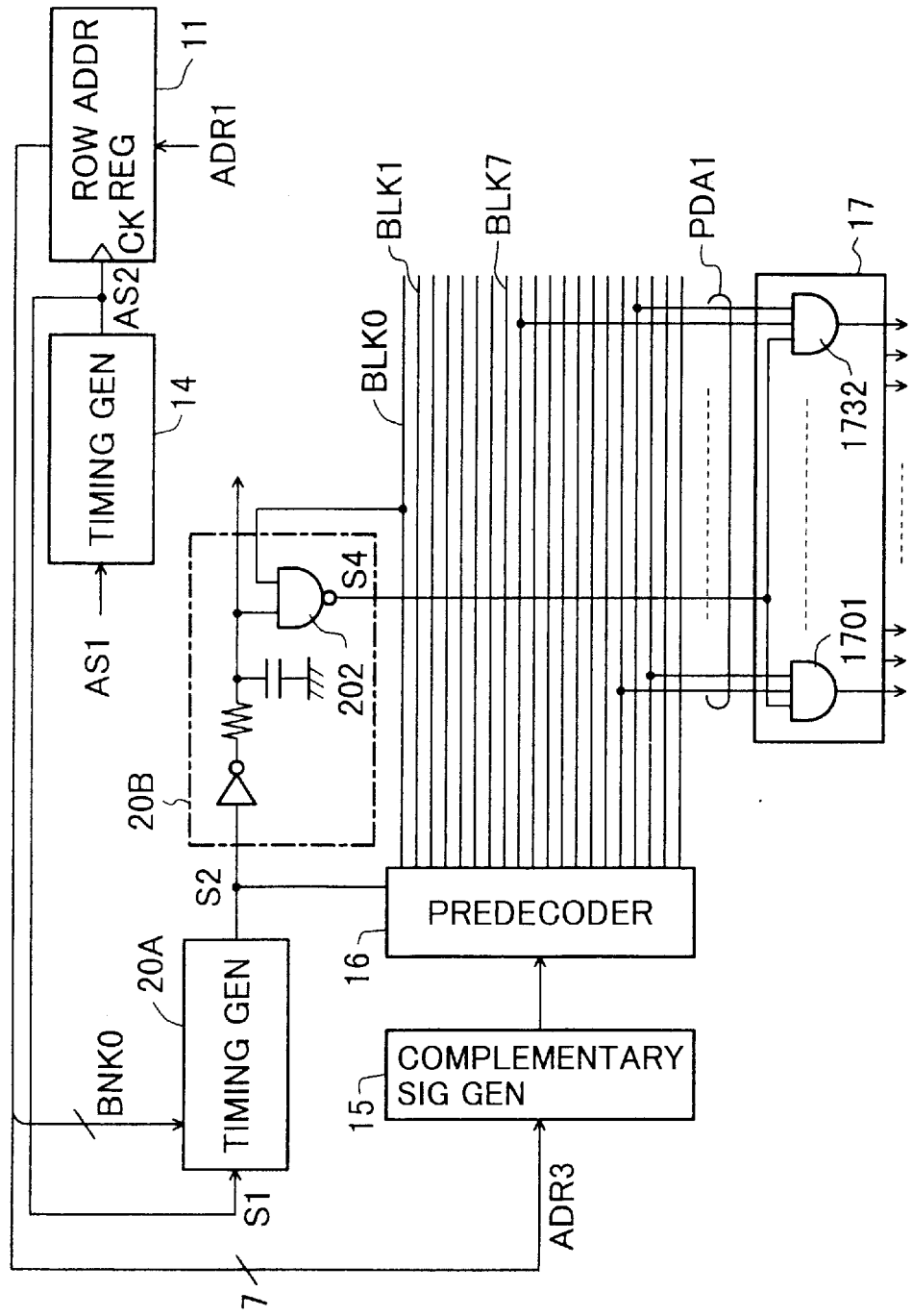
FIG. 9 is a schematic diagram showing a structural example of a part of the circuit of FIG. 8.

FIG. 8 shows the schematic structure of a circuit of a row address system in a memory device 10E according to the fourth embodiment of the present invention, and FIG. 9 shows a structural example of a part of the circuit of FIG. 8.

In the circuit, a timing generation circuit 20B is further added to the structure of FIG. 1. A strobe signal S4 is generated by the timing generation circuit 20B with delaying the output S2 of the timing generation circuit 20A, and the strobe signal S4 is provided to the word decoder 17 as in the case of FIG. 7.

In the timing generation circuit 20B, an input of a NAND gate 202 is connected to the output of a basic delay circuit to which a strobe signal S2 is provided. To the other input of the NAND gate 202, the memory block selection signal BLK0 from the predecoder 16 is provided.

The delay time at the timing generation circuit 20B corresponds to the comparatively short signal propagation a delay time from the predecoder 16 to the word decoder 17. Therefore the structure of the timing generation circuit 20B is simple with one stage of the basic delay circuit, and the circuit 20B can be disposed near the corresponding word decoder. Timing generation circuits, the structure of which is the same as that of the circuit 20B, are connected in cascade to the circuit 20B, and they are formed near the respective word decoders which are arranged near respective memory blocks (not shown). The memory block selection signals BLK2 through BLK7 are provided to the respective timing generation circuits while the outputs thereof are provided to the respective word decoders likewise as FIG. 9.

Fifth Embodiment

Figure 10:
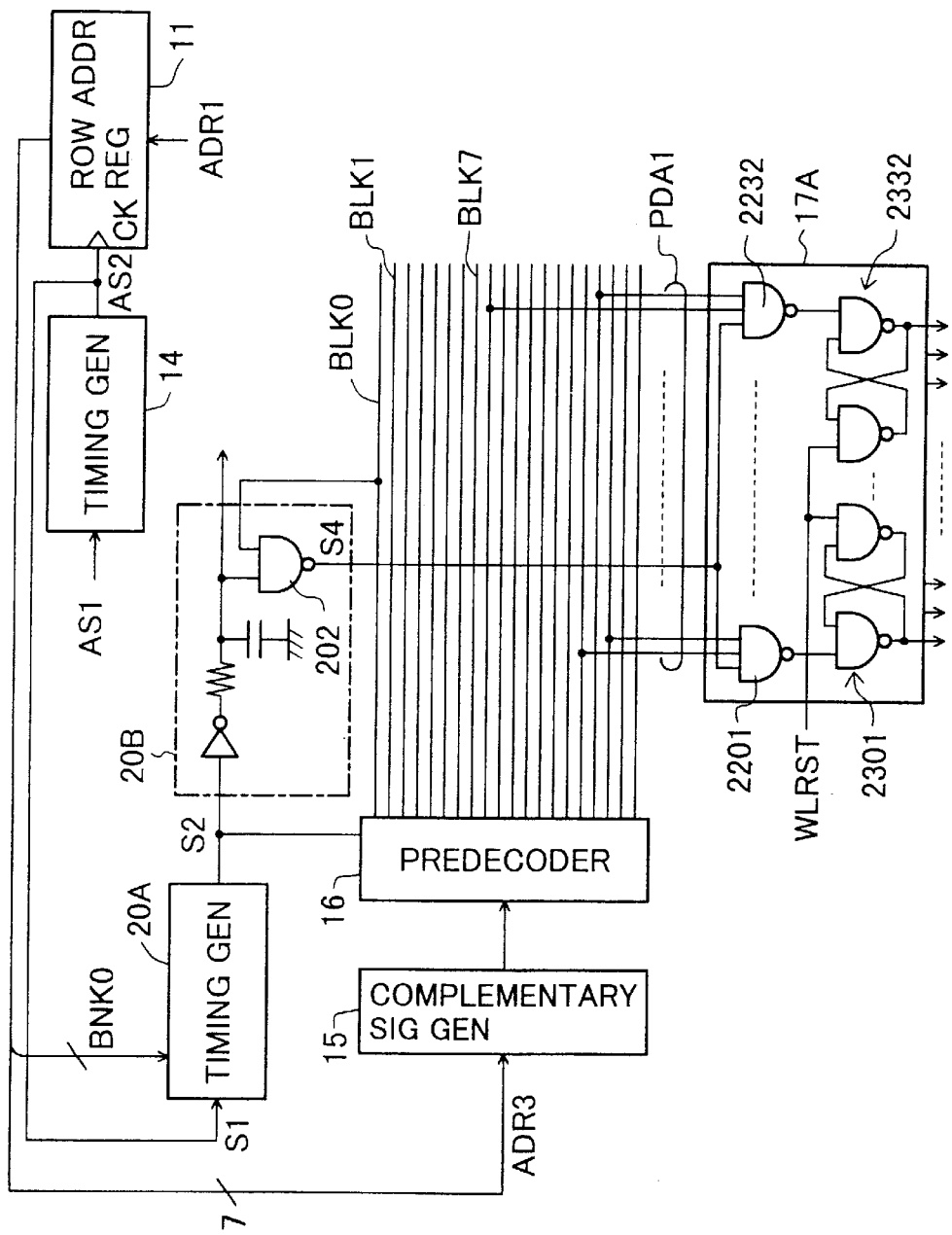
FIG. 10 is a schematic diagram showing a circuit, corresponding to FIG. 9, of a memory device according to the fifth embodiment of the present invention.

FIG. 10 shows a circuit, corresponding to FIG. 9, of a memory device according to the fifth embodiment of the present invention.

The memory device is, for example, a synchronous DRAM, and is provided with a plurality of banks.

In a multi-bank structure, when switching banks, processes are carried out in banks before and after being switched in parallel. Therefore, a higher speed operation is enabled.

In the circuit of FIG. 10, NAND gates 2201 through 2232 are employed in the word decoder 17A instead of the AND gates 1701 through 1732 in FIG. 9. This circuit is further provided with RS flip-flops 2301 through 2332 corresponding to the respective outputs of the NAND gates 2201 through 2232. The outputs of the NAND gates 2201 through 2232 are provided to the set inputs of the RS flip-flops 2301 through 2332, respectively. A word line reset signal WLRST from the control circuit 13 in FIG. 8 is commonly provided to the reset inputs of the RS flip-flops 2301 through 2332. The remainder of the structure is the same as that of FIG. 9.

In a state after the RS flip-flops 2301 through 2332 have been reset by a negative pulse of the word line reset signal WLRST, a negative pulse is outputted from selected one of the NAND gates 2201 through 2232 to set the corresponding one of the RS flip-flops 2301 through 2332.

With holding the outputs of the NAND gates 2201 through 2232 into the respective RS flip-flops 2301 through 2332 at the timing of a rise of the strobe signal S4, it becomes possible to hold a next row address for another bank in the row address register 11. Therefore, further higher speed operation is enabled than that of the first through fourth embodiments.

Sixth Embodiment

Figure 11:
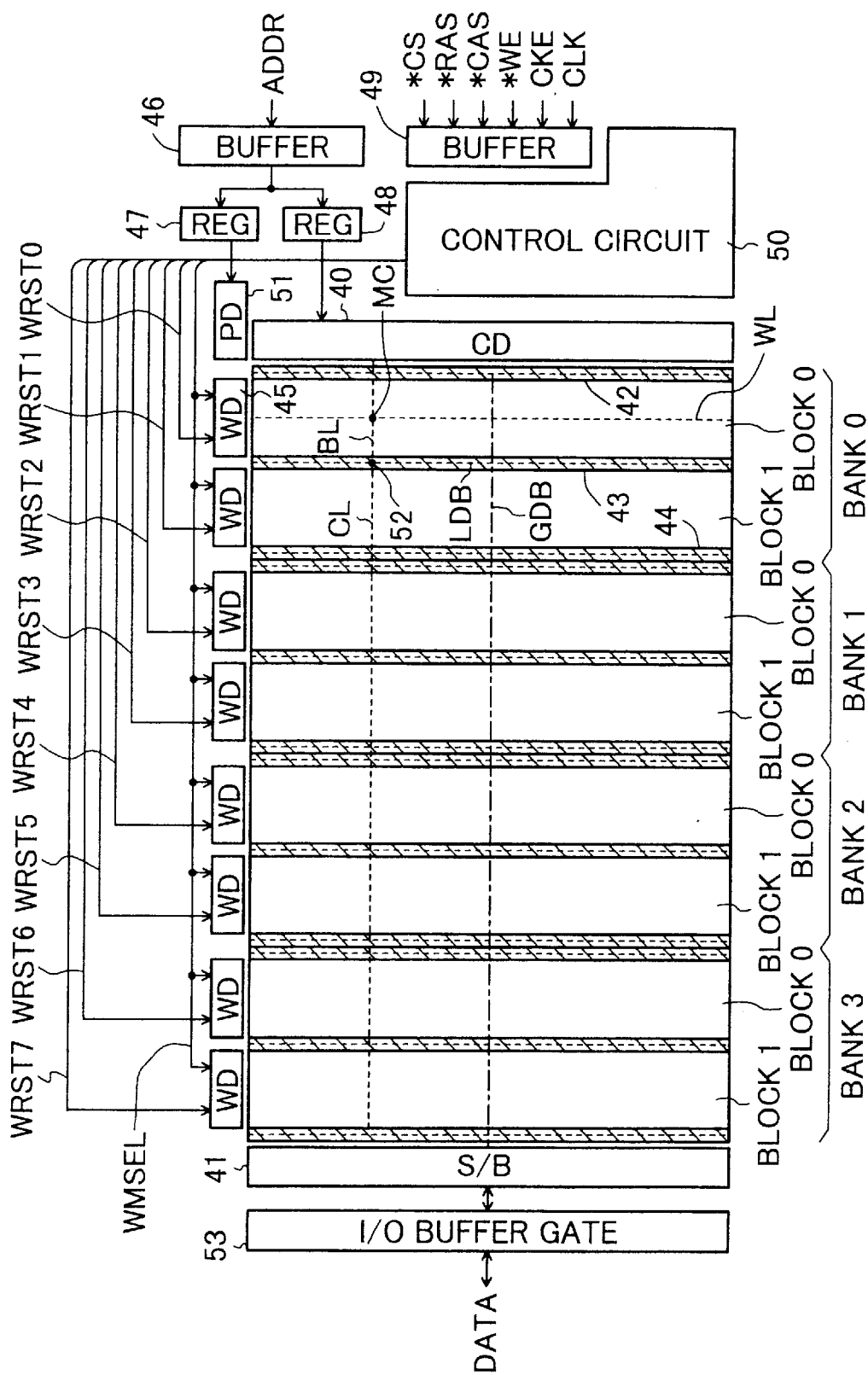
FIG. 11 is a schematic block diagram of a synchronous DRAM according to the sixth embodiment of the present invention.

FIG. 11 shows the schematic structure of a synchronous DRAM according to the sixth embodiment of the present invention. Each of the hatched area shows sense amplifier row.

In the synchronous DRAM, a column decoder 40 and a sense buffer circuit 41 are disposed so that banks 0 through 3 are placed therebetween.

The bank 0 is provided with sense amplifier rows 42 through 44, a memory block 0 between the sense amplifier rows 42 and 43 and another memory block 1 between the sense amplifier rows 43 and 44. A word decoder (WD) is arranged for each memory block. For example, the word decoder 45 corresponds to the memory block 0. The memory block 1 is the same as the memory block 0 excepting the memory block address. These are the same as regards each of the banks 1 through 3, excepting the bank address.

An address ADDR from external is provided via a buffer gate 46 for a signal level interface to address buffer registers 47 and 48. The chip selection signal *CS, low address strobe signal *RAS, column address strobe signal *CAS, write enable signal *WE, clock enable signal CKE, and clock CLK, which are from external, are provided via a buffer gate 49 to a control circuit 50. The control circuit 50 generates various control signals in response to commands, such as an activate command, a read command, a write command and so on, defined by values of combinations of the control signals *CS, *RAS, *CAS, *WE and CKE.

In response to issuance of the activate command ACT, the control circuit 50 causes the address buffer register 47 to hold a bank address, an in-bank block address and an in-block row address with providing a latch signal to the clock input of the address buffer register 47. The output of the address buffer register 47 is predecoded by a predecoder 51 and is further decoded by the word decoders including a word decoder 45, whereby a signal on the selected word line WL in the selected bank and block is caused to rise.

With this rise, the memory contents in a row along the word line WL are read out onto bit lines including a bit line BL, and amplified by sense amplifier rows 42 and 43. In further detail, for example, the memory content of a memory cell MC is read out onto the bit line BL and amplified by a sense amplifier 52 in the sense amplifier row 43.

In response to issuance of the read command READ, the control circuit 50 causes the address buffer register 48 to hold a column address with providing a latch signal to the clock input of the address buffer register 48. The output of the address buffer register 48 is decoded by a column decoder 40, and one of the column gates is turned on with the selected column selection line, for example, CL being activated, whereby the data on the bit line BL passes through a local data bus LDB disposed along-the sense amplifier row 43 and a global data bus GDB in a direction orthogonal thereto, and amplified by the sense buffer circuit 41. The output of the circuit 41 is taken out as DATA via an I/O buffer gate circuit 53 for a signal level interface.

Multiple selection signals WMSEL are commonly provided from the control circuit 50 to word decoders (WD) of 8 blocks, and word line reset signals WRST1 through WRST7 are provided to these blocks, respectively. The multiple selection signal WMSEL is activated only in a acceleration test with a high-temperature, while it is inactive during normal use.

Figure 12:
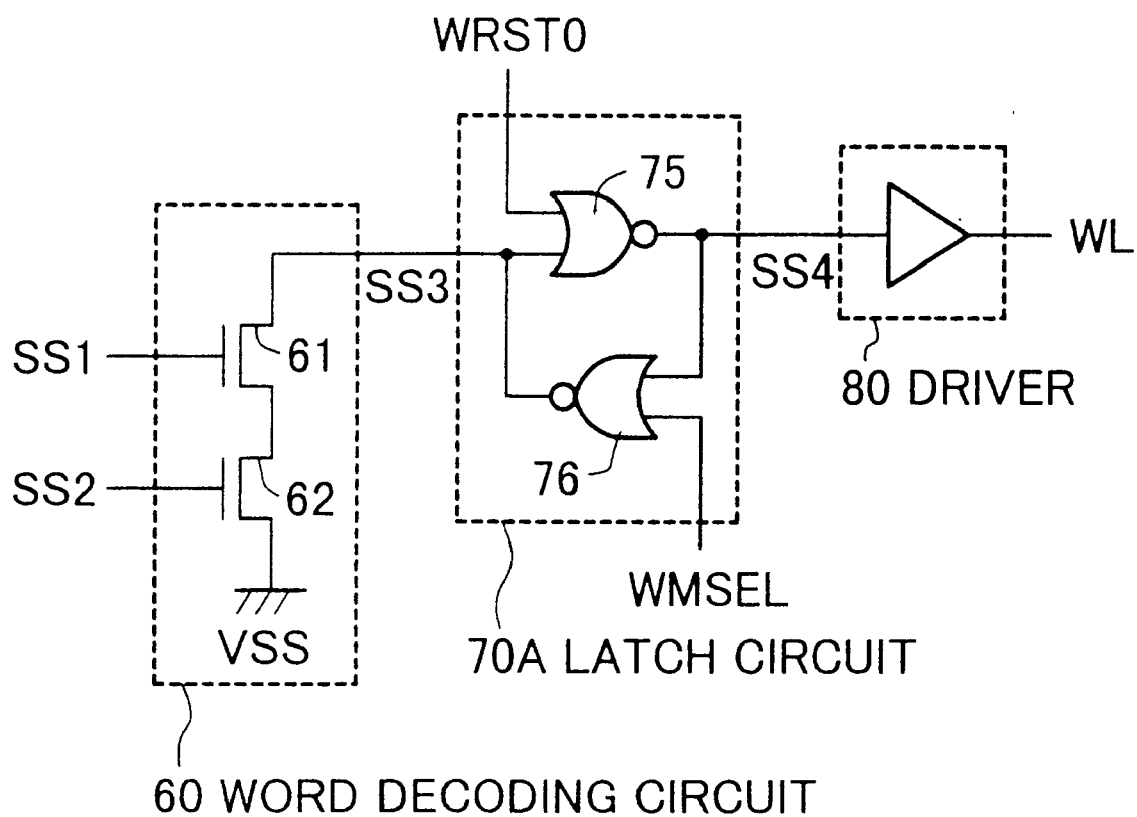
FIG. 12 is a schematic diagram showing a part, for one word line, of a word decoder in FIG. 11.

FIG. 12 shows a circuit for one word line, which is a part of the word decoder 45 in FIG. 11.

In a latch circuit 70A, the output of a NOR gate 75 is connected to one input of a NOR gate 76, the output of the NOR gate 76 is connected to one input of the NOR gate 75. The word line reset signal WRST0 and multiple selection signal WMSEL are provided to the other inputs of the NOR gates 75 and 76, respectively.

Figure 20:
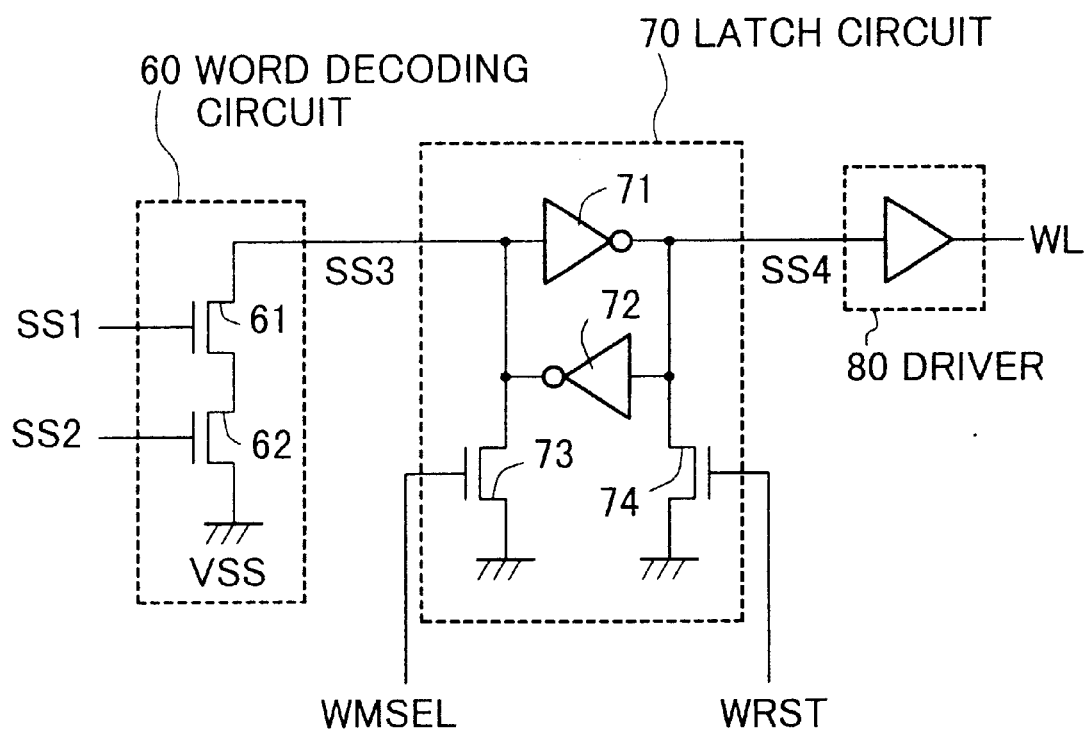
FIG. 20 is a diagram showing a part, for one word line, of a prior art word decoder.

The remainder of the structure is the same as that in FIG. 20.

Figure 13:
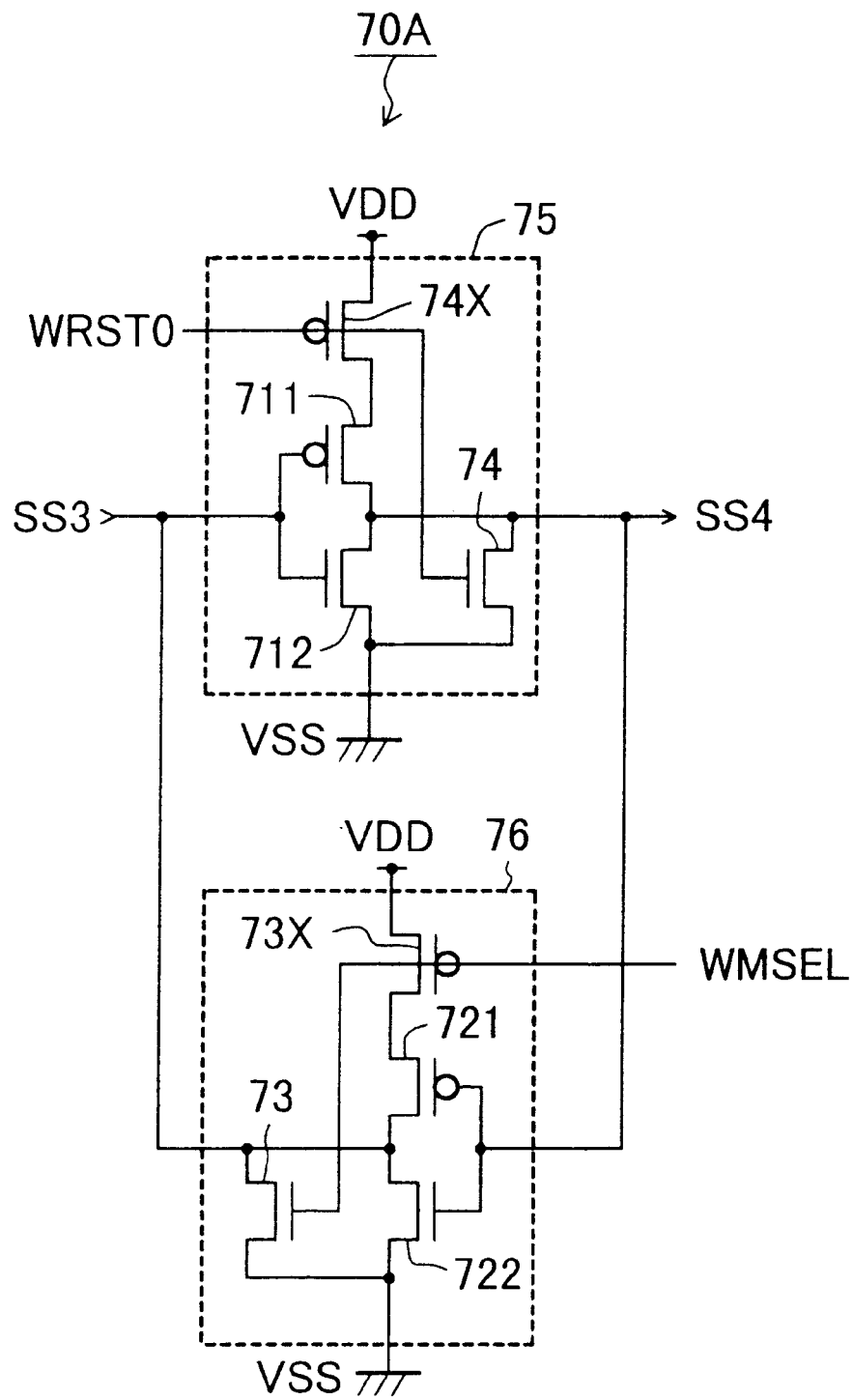
FIG. 13 is a diagram showing a structural example of a latch circuit in FIG. 12.

FIG. 13 shows a structural example of the latch circuit 70A in FIG. 12.

In the NOR gate 75, a PMOS transistor 74X is connected between a PMOS transistor 711 and a wiring of a power source potential VDD. The gate electrode of the PMOS transistor 74X is commonly connected to the gate electrode of the NMOS transistor 74, wherein the word line reset signal WRST0 is provided to the both gate electrodes. Likewise, in the NOR gate 76, a PMOS transistor 73X is connected between the PMOS transistor 721 and the wiring of the power source potential VDD. The gate electrode of the PMOS transistor 73X is commonly connected to the gate electrode of the NMOS transistor 73, wherein the multiple selection signal WMSEL is provided to the both gate electrodes.

Figure 21:
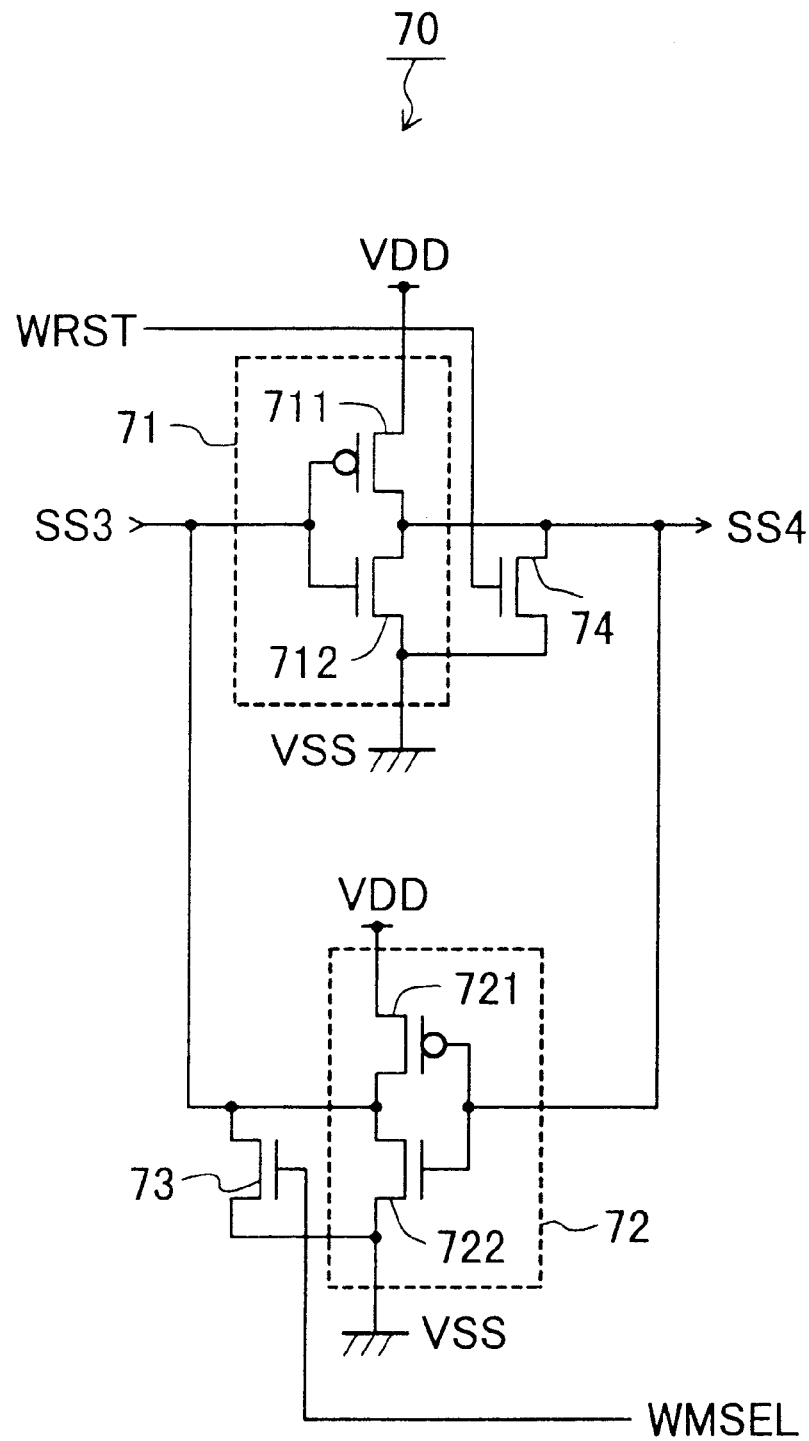
FIG. 21 is a diagram showing a prior art structural example of the latch circuit in FIG. 20.

The remainder of the structure is the same as that in FIG. 21.

Next, a description is given of operations of the sixth embodiment constructed as described above.

In FIG. 12, the multiple selection signal WMSEL and word line reset signal WRST0 are low when they are inactive. At this state, each of NOR gates 75 and 76 functions as an inverter.

In order to select the word line WL in the block 0 of the bank 0 in FIG. 11, the predecoded signals SS1 and SS2 in FIG. 12 are made high, whereby the signal SS3 becomes low and the signal SS4 becomes high. In this state, in FIG. 13, the PMOS transistors 74X, 711, 73X and NMOS transistor 722 are on and the NMOS transistors 712, 74, PMOS transistors 721 and NMOS transistor 73 are off. The drive capacity of the signal SS4 is amplified by a driver 80, and the word line WL is caused to rise. Since the state of the latch circuit 70A is held, another address in another bank can be held in the buffer register 47 on the next rise of the clock CLK, whereby it is possible to carry out parallel accesses for a plurality of banks.

Since only the block 0 is activated in order to reduce power consumption, the word line reset signal WRST0 commonly provided to all the latch circuits in the block 0 is made high when finishing an access, whereby the NMOS transistor 74 in FIG. 13 is turned on, and the signal SS4 is changed to low. Thus, the word lines WL falls. Since the PMOS transistor 74X is turned off at the same time when the NMOS transistor 74 is turned on, a through-current is prevented from flowing from the power source potential VDD through the PMOS transistor 711 and the NMOS transistor 74 to the power source potential VSS. Therefore, power consumption under normal use can be reduced. The NMOS transistor 722 changes to off, and the PMOS transistor 721 changes to on, whereby the signal SS3 becomes high. Thereby, the PMOS transistor 711 is turned off, and the NMOS transistor 712 is turned on. Next, the word line reset signal WRST0 is returned to low.

Before the shipment of chips, in order to carry out a high-temperature acceleration test with the signals on all the word lines rising, a signal line of the multiple selection signal WMSEL is commonly connected to all the latch circuits in the word decoders. In this test, the multiple selection signal WMSEL is made high, whereby the NMOS transistor 73 goes on and the signal SS3 changes to low. At the same time, since the PMOS transistor 73X goes off, a through-current is prevented from flowing from the power source potential VDD through the PMOS transistor 721 and NMOS transistor 73 to the power source potential VSS. The PMOS transistor 711 is changed to on and the NMOS transistor 712 is changed to off, whereby the signal SS4 goes high and the word line WL is caused to rise. On the other hand, the PMOS transistor 721 is turned off, and the NMOS transistor 722 is turned on. Next, the multiple selection signal WMSEL is returned to low.

In this state, the word line reset signals WRST0 through WRST7 are changed to high, whereby the signals on all the word lines are caused to fall. At this operation, through-current in the latch circuits is prevented by the above-mentioned resetting operation.

Such operation is simultaneously carried out for all the word decoders. However, since the through-current is prevented, the acceleration test with setting the ambient temperature at a high can be further accurately carried out.

Figure 14:
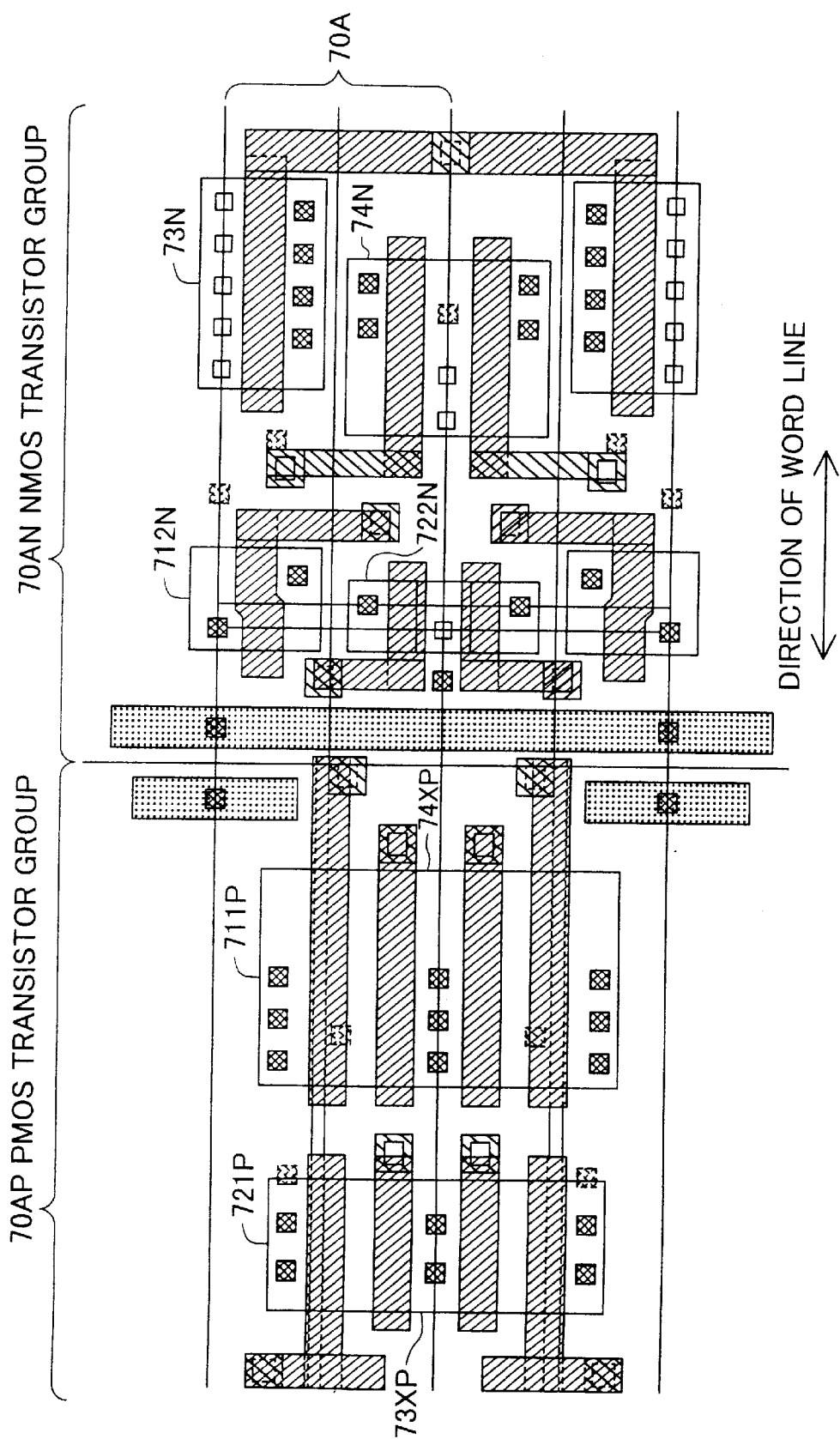
FIG. 14 is a layout pattern diagram of a diffusion area and a polysilicon wiring layer including two latch circuits of FIG. 12.
Figure 15:
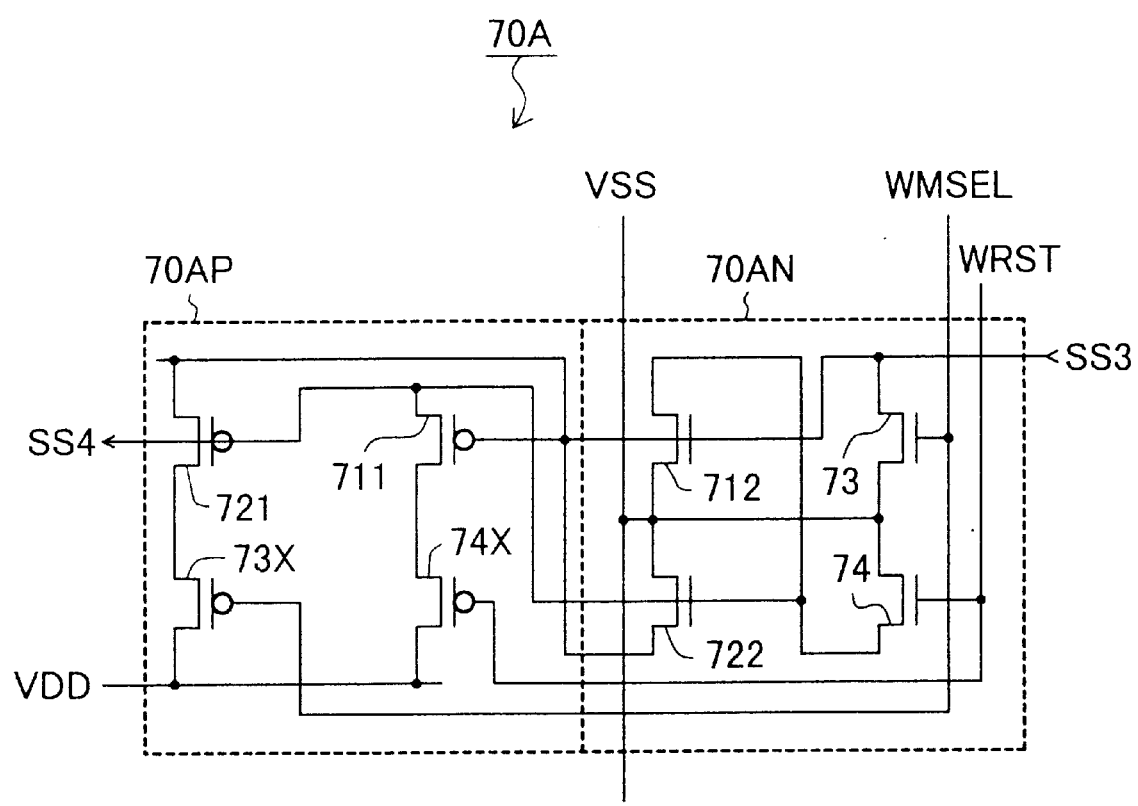
FIG. 15 is a circuit diagram in which transistors are arranged corresponding to the layout pattern of FIG. 14.

FIG. 14 shows a layout pattern of a diffusion area and a polysilicon wiring layer of the adjacent two latch circuits. In FIG. 14, no metal wiring layer pattern is shown in order to avoid complications. FIG. 15 shows a circuit diagram in which transistors are disposed so as to correspond to the layout pattern of FIG. 14, for better understanding the pattern of FIG. 14.

In order to reduce the occupying area of the latch circuit 70A, transistors are arrayed with the PMOS transistor group 70P and NMOS transistor group 70N separated from each other, and further, the groups 70P and 70N are disposed along the word line direction with their outlines being band-shaped. Each of the PMOS transistor group 70P and the NMOS transistor group 70N is provided with transistor array in two rows and in two columns.

In FIG. 14, 721P, 73XP, 711P and 74XP are p-type diffusion regions of the PMOS transistors 721, 73X, 711 and 74X, respectively, while 712N, 722N, 73N and 74N are N-type diffusion regions of the NMOS transistors 712, 722, 73 and 74, respectively. The hatched areas denote polysilicon wirings, and small rectangles are between-layer contact holes. As regards the wirings of dotted patterns, the wiring at the side of the transistor group 70AP is for applying a power source potential VDD to the N well, and the wiring at the side of the transistor group 70AN is for applying a power source potential VSS to the P well.

Figure 22:
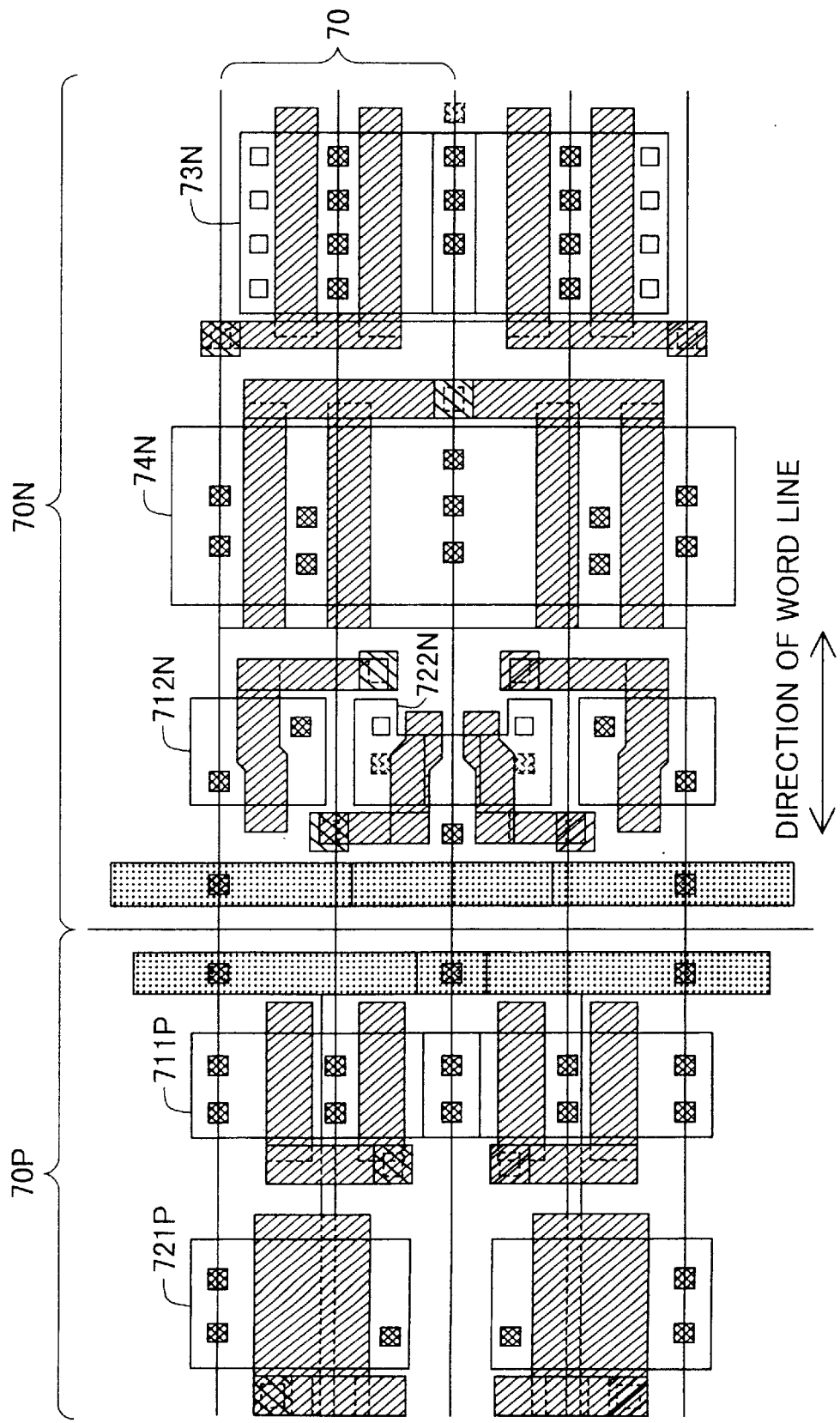
FIG. 22 is a schematic diagram showing a layout pattern of a diffusion area and a polysilicon wiring layer including two latch circuits of FIG. 21.
Figure 23:
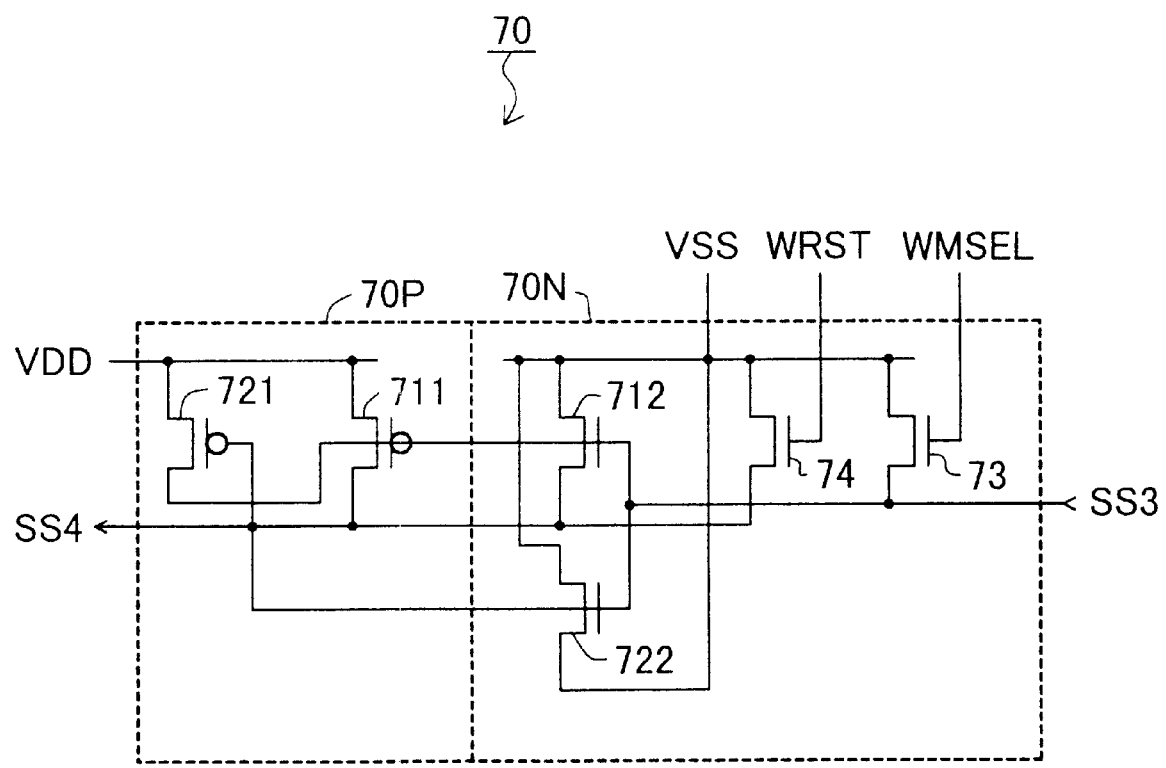
FIG. 23 is a circuit diagram in which transistors are disposed corresponding to the layout pattern of FIG. 22.

In comparing FIG. 14 with FIG. 22, it can be understood that the occupying areas are almost the same to each other.

With the memory device according to the sixth embodiment, the through-current can be prevented without increasing the occupying area of the latch circuit 70A.

Seventh Embodiment

Figure 16:
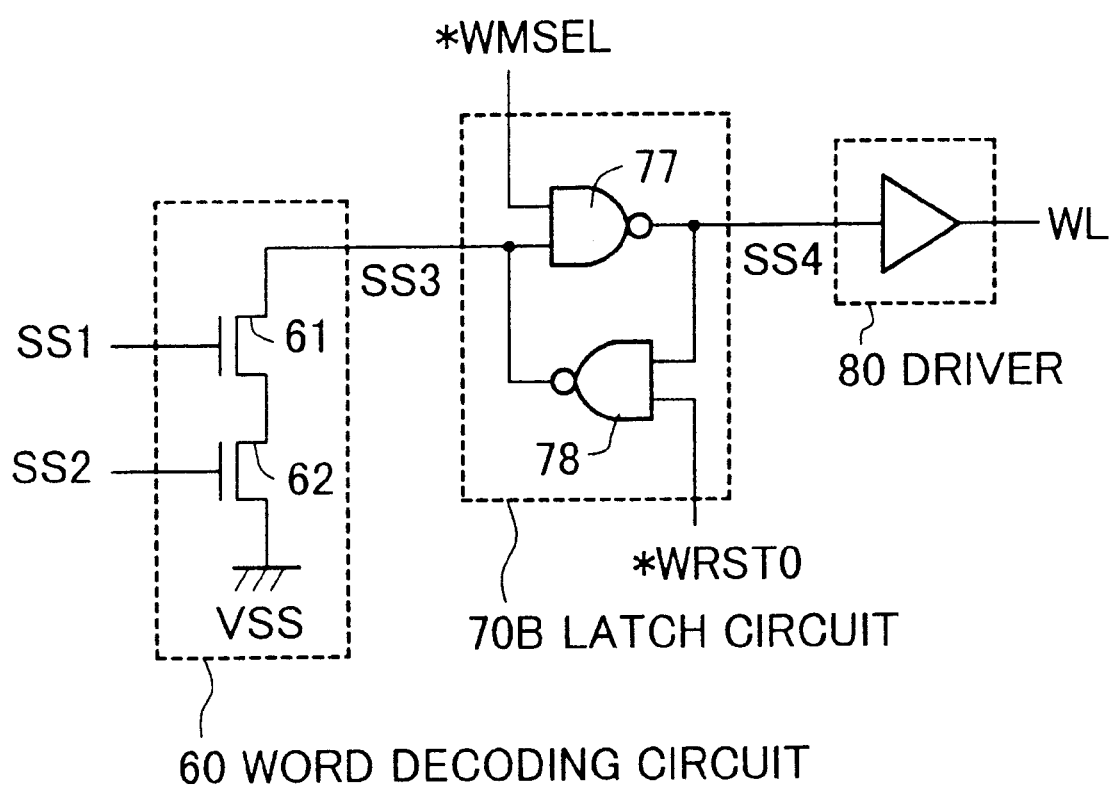
FIG. 16 is a schematic diagram showing a part, for one word line, of a word decoder according to the seventh embodiment of the present invention.

FIG. 16 shows a circuit for one word line according to the seventh embodiment of the present invention, which is a part of the word decoder.

In the latch circuit 70B, NAND gates 77 and 78 are employed instead of the NOR gates 75 and 76 in FIG. 12. *WRST0 and *WMSEL which are complementary signals of the word line reset signal WRST0 and multiple selection signal WMSEL are provided to one input of the NAND gates 78 and 77, respectively. The multiple selection signal *WMSEL and the word line reset signal *WRST0 are high when they are inactive, and in this state each of the NAND gates 77 and 78 functions as an inverter.

The remainder of the structure is the same as that of FIG. 12.

Figure 17:
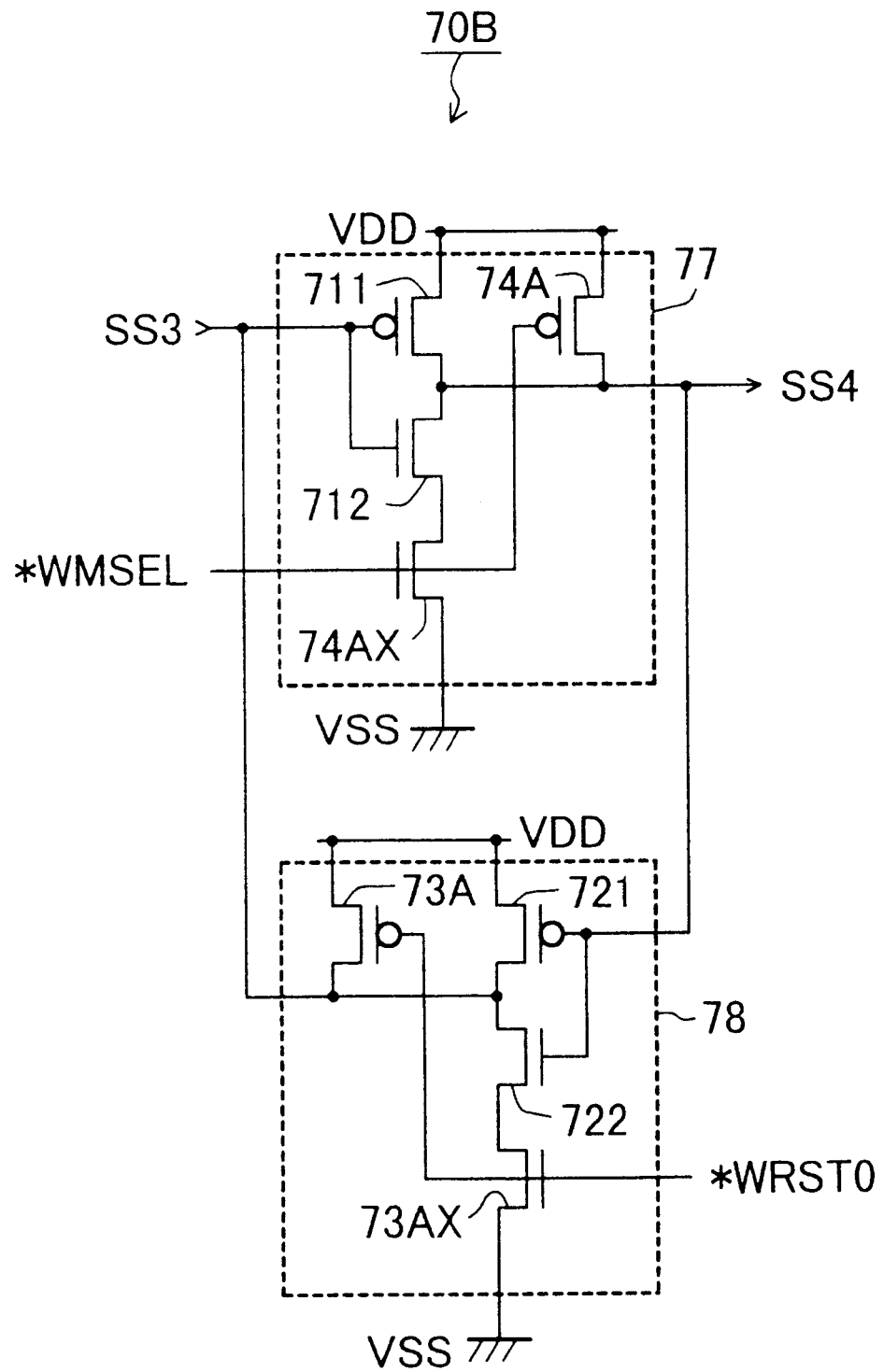
FIG. 17 is a diagram showing a structural example of the latch circuit in FIG. 16.

FIG. 17 shows a structural example of the latch circuit 70B in FIG. 16.

In the NAND gate 77, a PMOS transistor 74A is connected in parallel to the PMOS transistor 711, an NMOS transistor 74AX is connected between the NMOS transistor 712 and the power source potential VSS, and the gate electrode of the PMOS transistor 74A is commonly connected to the gate electrode of the NMOS transistor 74AX. The multiple selection signal *WMSEL is provided to these both gate electrodes. Likewise, in the NAND gate 78, a PMOS transistor 73A is connected in parallel to the PMOS transistor 721, an NMOS transistor 73AX is connected between the NMOS transistor 722 and the power source potential VSS, and the gate electrode of the PMOS transistor 73A is commonly connected to the gate electrode of the NMOS transistor 73AX. *WRST0 is provided to these both gate electrodes.

The remainder of the structure is the same as that of FIG. 21.

Next, a description is given of operations of the seventh embodiment constructed as described above.

At the end of access, the word line reset signal *WRST0 is made low, whereby the PMOS transistor 73A is turned on, and the signal SS3 is changed to high. Simultaneously, since the NMOS transistor 73AX is turned off, a through-current is prevented from flowing from the power source potential VDD through the PMOS transistor 73A and NMOS transistor 722 to the power source potential VSS. Thereby, power consumption under normal use can be reduced. The signal SS4 is changed to low, and the word line WL is caused to fall. Next, the word line reset signal *WRST0 is returned to high.

In a high-temperature acceleration test, the multiple selection signal *WMSEL is caused to go low, whereby the PMOS transistor 74A is turned on, the signal SS4 is changed to high, and the word line WL is caused to rise. Since the NMOS transistor 74AX is turned off at the same time when the PMOS transistor 74A is turned on, a through-current is prevented from flowing from the power source potential VDD through the PMOS transistor 74A and NMOS transistor 712 to the power source potential VSS. The signal SS3 becomes low, and next, the multiple selection signal *WMSEL is returned to high.

In this state, the word line reset signal *WRST0 is changed to low to cause the word line WL to fall. At this operation, the through-current in the latch circuit 70B can be prevented by the above-mentioned resetting operation.

Such operation is simultaneously carried out at each word decoder, and since the through-current is prevented, the high-temperature acceleration test can be carried out more accurately than in the case of prior art.

Although preferred embodiments of the present invention has been described, it is to be understood that the invention is not limited thereto and that various changes and modifications may be made without departing from the spirit and scope of the invention.

For example, in FIG. 13, the connections of the signal lines of SS4 and WMSEL to the NOR gate 76 may be replaced to each other. The same may be applied for the latch circuit 70B of FIG. 17.

What is claimed is:

1. A memory device including a word decoder, said word decoder comprising:

a word decoding circuit having an output to provide a set signal in response to a predecoded row-address signal; and a latch circuit coupled between said output of said word decoding circuit and one of word lines in a memory cell array, wherein said latch circuit comprises:

a PMOS transistor and an NMOS transistor connected in series between first and second power source potentials;

a first MOS transistor connected in parallel to one of said PMOS transistor or said NMOS transistor; and a second MOS transistor connected in series to the other of said PMOS transistor or said NMOS transistor, said second MOS transistor being operated in such a way that the on/off states of said first and second MOS transistors are reverse to each other.

2. A memory device according to claim 1, wherein said first MOS transistor is an NMOS transistor connected in parallel to said NMOS transistor, said second MOS transistor is a PMOS transistor connected in series to said PMOS transistor, and a gate electrode of said first MOS transistor is connected to a gate electrode of said second MOS transistor.

3. A memory device according to claim 2, wherein said gate electrodes of said first and second MOS transistors are adapted to receive a reset signal, and gate electrodes of said PMOS and NMOS transistors connected in series are adapted to receive said set signal.

4. A memory device according to claim 1, wherein said first MOS transistor is an PMOS transistor connected in parallel to said PMOS transistor, said second MOS transistor is a NMOS transistor connected in series to said NMOS transistor, and a gate electrode of said first MOS transistor is connected to a gate electrode of said second MOS transistor.

5. A memory device according to claim 4, wherein said gate electrodes of said first and second MOS transistors are adapted to receive another set signal, and gate electrodes of said PMOS and NMOS transistors connected in series are adapted to receive said set signal.

6. A memory device including a word decoder, said word decoder comprising:

a word decoding circuit having an output to provide a set signal in response to a predecoded row-address signal; and a latch circuit coupled between said output of said word decoding circuit and one of word lines in a memory cell array, wherein said latch circuit comprises:

a first NOR gate having a first input adapted to receive a reset signal, a second input adapted to receive said set signal and an output coupled to said one of said word lines; and a second NOR gate having a first input adapted to receive another set signal, a second input coupled to said output of said first NOR gate and an output coupled to said first input of said first NOR gate.

7. A memory device according to claim 6, wherein said memory device comprises a plurality of word decoders each having the same structure as said word decoder, wherein said word decoder comprises a plurality of word decoding circuits each having the same structure as said word decoding circuit and a plurality of respective latch circuits each having the same structure as said latch circuit, said word decoders further comprises a multiple selection line coupled to said first input of said second NOR gate in each of said latch circuits in each of said word decoders, for commonly providing said another set signal.

8. A memory device according to claim 7, wherein each one of said word decoder further comprises an individual reset signal line coupled to said first input of said first NOR gate in each of said latch circuits in said one of said word decoders, for commonly providing said reset signal.

9. A memory device according to claim 7, wherein said latch circuit is provided with a PMOS transistor array in two rows and two columns, and a NMOS transistor array in two rows and two columns, said PMOS transistor array and said NMOS transistor array are arranged in a word line direction, wherein each of said first and second NOR gates is constructed with two PMOS transistors within said PMOS transistor array and two NMOS transistors within said NMOS transistor array.

10. A memory device including a word decoder, said word decoder comprising:

a word decoding circuit having an output to provide a set signal in response to a predecoded row-address signal; and a latch circuit coupled between said output of said word decoding circuit and one of word lines in a memory cell array, wherein said latch circuit comprises:

a first NAND gate having a first input adapted to receive another set signal, a second input adapted to receive said set signal and an output coupled to said one of said word lines; and a second NAND gate having a first input adapted to receive a reset signal, a second input coupled to said output of said first NAND gate and an output coupled to said first input of said first NAND gate.

11. A memory device according to claim 10, wherein said memory device comprises a plurality of word decoders each having the same structure as said word decoder, wherein said word decoder comprises a plurality of word decoding circuits each having the same structure as said word decoding circuit and a plurality of respective latch circuits each having the same structure as said latch circuit, said word decoders further comprises a multiple selection line coupled to said first input of said first NAND gate in each of said latch circuits in each of said word decoders, for commonly providing said another set signal.

12. A memory device according to claim 11, wherein each one of said word decoder further comprises an individual reset signal line coupled to said first input of said second NAND gate in each of said latch circuits in said one of said word decoders, for commonly providing said reset signal.

* * * * *